(12) United States Patent
Huang

(10) Patent No.: US 11,791,294 B2
(45) Date of Patent: Oct. 17, 2023

(54) METHOD FOR FABRICATING SEMICONDUCTOR DEVICE WITH STRESS RELIEF STRUCTURE

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 36 days.

(21) Appl. No.: 17/550,348

(22) Filed: Dec. 14, 2021

(65) Prior Publication Data

US 2022/0102303 A1 Mar. 31, 2022

Related U.S. Application Data

(62) Division of application No. 16/665,813, filed on Oct. 28, 2019.

(51) Int. Cl.
| | |
|---|---|
| *H01L 23/00* | (2006.01) |
| *H01L 23/528* | (2006.01) |
| *H01L 21/02* | (2006.01) |
| *H01L 23/522* | (2006.01) |
| *H10B 12/00* | (2023.01) |

(52) U.S. Cl.
CPC ........ *H01L 24/05* (2013.01); *H01L 21/02063* (2013.01); *H01L 23/528* (2013.01); *H01L 23/5226* (2013.01); *H01L 24/03* (2013.01); *H10B 12/0335* (2023.02); *H10B 12/053* (2023.02); *H10B 12/34* (2023.02); *H01L 2224/0225* (2013.01); *H01L 2224/02251* (2013.01); *H01L 2224/02381* (2013.01); *H01L 2224/05144* (2013.01); *H01L 2224/05155* (2013.01); *H01L 2224/05647* (2013.01); *H01L 2924/35* (2013.01); *H10B 12/315* (2023.02)

(58) Field of Classification Search
CPC . H10B 12/34; H01L 29/7825; H01L 29/7813; H01L 23/5226; H01L 23/528; H01L 24/05; H01L 2224/0225; H01L 2224/02251; H01L 2224/02381; H01L 2224/05144; H01L 2224/05155; H01L 2224/05575

See application file for complete search history.

(56) References Cited

U.S. PATENT DOCUMENTS

| | | |
|---|---|---|
| 9,812,414 B1 | 11/2017 | Lin |
| 2003/0230809 A1 | 12/2003 | Nakajima et al. |
| 2005/0202221 A1* | 9/2005 | Wang ............... H01L 24/05 |
| | | 428/209 |

(Continued)

OTHER PUBLICATIONS

Office Action dated Jul. 15, 2022 related to U.S. Appl. No. 16/665,813, wherein this application is a DIV of U.S. Appl. No. 16/665,813.

(Continued)

*Primary Examiner* — Latanya N Crawford Eason
(74) *Attorney, Agent, or Firm* — Xuan Zhang

(57) ABSTRACT

The present application discloses a method for fabricating semiconductor device with a stress relief structure. The method includes providing a substrate, forming an intrinsically conductive pad above the substrate, and forming a stress relief structure above the substrate and distant from the intrinsically conductive pad.

13 Claims, 35 Drawing Sheets

(56) References Cited

U.S. PATENT DOCUMENTS

| | | | |
|---|---|---|---|
| 2010/0159690 A1* | 6/2010 | Kasaoka | H01L 24/48 |
| | | | 257/E21.575 |
| 2011/0018128 A1* | 1/2011 | Wei | H01L 21/76801 |
| | | | 257/E21.294 |
| 2015/0108605 A1* | 4/2015 | Park | H10B 12/50 |
| | | | 257/532 |
| 2017/0047301 A1* | 2/2017 | Yang | H01L 24/03 |
| 2017/0186802 A1* | 6/2017 | Huang | H01L 27/14689 |
| 2018/0350865 A1* | 12/2018 | Huang | H01L 27/14689 |
| 2019/0214296 A1* | 7/2019 | Wang | H01L 21/76879 |
| 2019/0393160 A1 | 12/2019 | Wang et al. | |
| 2020/0098707 A1 | 3/2020 | Chen et al. | |

OTHER PUBLICATIONS

Office Action dated Sep. 28, 2022 related to U.S. Appl. No. 16/665,813, wherein this application is a DIV of U.S. Appl. No. 16/665,813.

Office Action dated Feb. 8, 2022 related to U.S. Appl. No. 16/665,813, wherein this application is a DIV of U.S. Appl. No. 16/665,813.

Office Action dated Feb. 21, 2023 related to U.S. Appl. No. 16/665,813, wherein this application is a DIV of U.S. Appl. No. 16/665,813.

* cited by examiner

METHOD FOR FABRICATING SEMICONDUCTOR DEVICE WITH STRESS RELIEF STRUCTURE

CROSS-REFERENCE TO RELATED APPLICATION

This application is a divisional application of U.S. Non-Provisional application Ser. No. 16/665,813 filed Oct. 28, 2019, which is incorporated herein by reference in its entirety.

TECHNICAL FIELD

The present disclosure relates to a semiconductor device and a method for fabricating the semiconductor device, and more particularly, to a semiconductor device with a stress relief structure and a method for fabricating the semiconductor device with a stress relief structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, an intrinsically conductive pad positioned above the substrate, a stress relief structure positioned above the substrate and distant from the intrinsically conductive pad, and an external bonding structure positioned directly above the stress relief structure.

In some embodiments, the stress relief structure comprises a conductive frame and a plurality of insulating segments positioned within the conductive frame.

In some embodiments, each of the plurality of insulating segments has a square shape and the insulating segments are separated from each other.

In some embodiments, the semiconductor device further comprises a plurality of word lines positioned in the substrate and extending along a first direction, wherein each of the plurality of insulating segments has a rectangular shape and extends along a second direction perpendicular to the first direction.

In some embodiments, the semiconductor device further comprises a plurality of word lines positioned in the substrate and extending along a first direction, wherein each of the plurality of insulating segments has a rectangular shape and extends along a second direction diagonal with respect to the first direction.

In some embodiments, the semiconductor device further comprises a redistribution conductive layer positioned above the stress relief structure and the intrinsically conductive pad.

In some embodiments, the semiconductor device further comprises a stress-buffering layer positioned below the external bonding structure, wherein the stress-buffering layer is formed of a material having a coefficient of thermal expansion of less than about 20 ppm/° C. and a Young's Modulus of less than about 15 GPa.

In some embodiments, the external bonding structure comprises a bottom bonding layer positioned directly above the stress relief structure and a top bonding layer positioned above the bottom bonding layer.

In some embodiments, the external bonding structure comprises a bottom bonding layer positioned directly above the stress relief structure, a middle bonding layer positioned on the bottom bonding layer, and a top bonding layer positioned on the middle bonding layer.

In some embodiments, a width of the external bonding structure is less than a width of the stress relief structure.

In some embodiments, the semiconductor device further comprises a wiring layer positioned on the external bonding structure.

In some embodiments, a width of the wiring layer is less than a width of the external bonding structure.

In some embodiments, the semiconductor device further comprises two spacers positioned adjacent to two sides of the external bonding structure.

Another aspect of the present disclosure provides a method for fabricating a semiconductor device including providing a substrate, forming an intrinsically conductive pad above the substrate, and forming a stress relief structure above the substrate and distant from the intrinsically conductive pad.

In some embodiments, forming the stress relief structure above the substrate and distant from the intrinsically conductive pad comprises: forming a conductive frame above the substrate; and forming a plurality of insulating segments within the conductive frame.

In some embodiments, the method for fabricating the semiconductor device further comprises: forming a redistribution conductive layer above the intrinsically conductive pad and the stress relief structure.

In some embodiments, the method for fabricating the semiconductor device further comprises: forming a plurality of passivation layers above the redistribution conductive layer and forming a first pad opening in the plurality of passivation layers.

In some embodiments, the method for fabricating the semiconductor device further comprises: performing a passivation process comprising soaking the first pad opening with a precursor, wherein the precursor is dimethylaminotrimethylsilane or tetramethylsilane.

In some embodiments, the method for fabricating the semiconductor device further comprises: performing a cleaning process, wherein the cleaning process comprises applying a remote plasma to the first pad opening.

In some embodiments, the method for fabricating the semiconductor device further comprises: forming an external bonding structure on the redistribution conductive layer; wherein the external bonding structure comprises a bottom bonding layer formed on the redistribution conductive layer and a top bonding layer formed on the bottom bonding layer.

Due to the design of the semiconductor device of the present disclosure, the stress relief structure may distribute the stress of wiring; therefore, the delamination of the plurality of insulating films may be reduced. As a result, the yield of the semiconductor device may be improved. In addition, a passivation process may reduce undesirable sidewall growth of the plurality of passivation layers.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
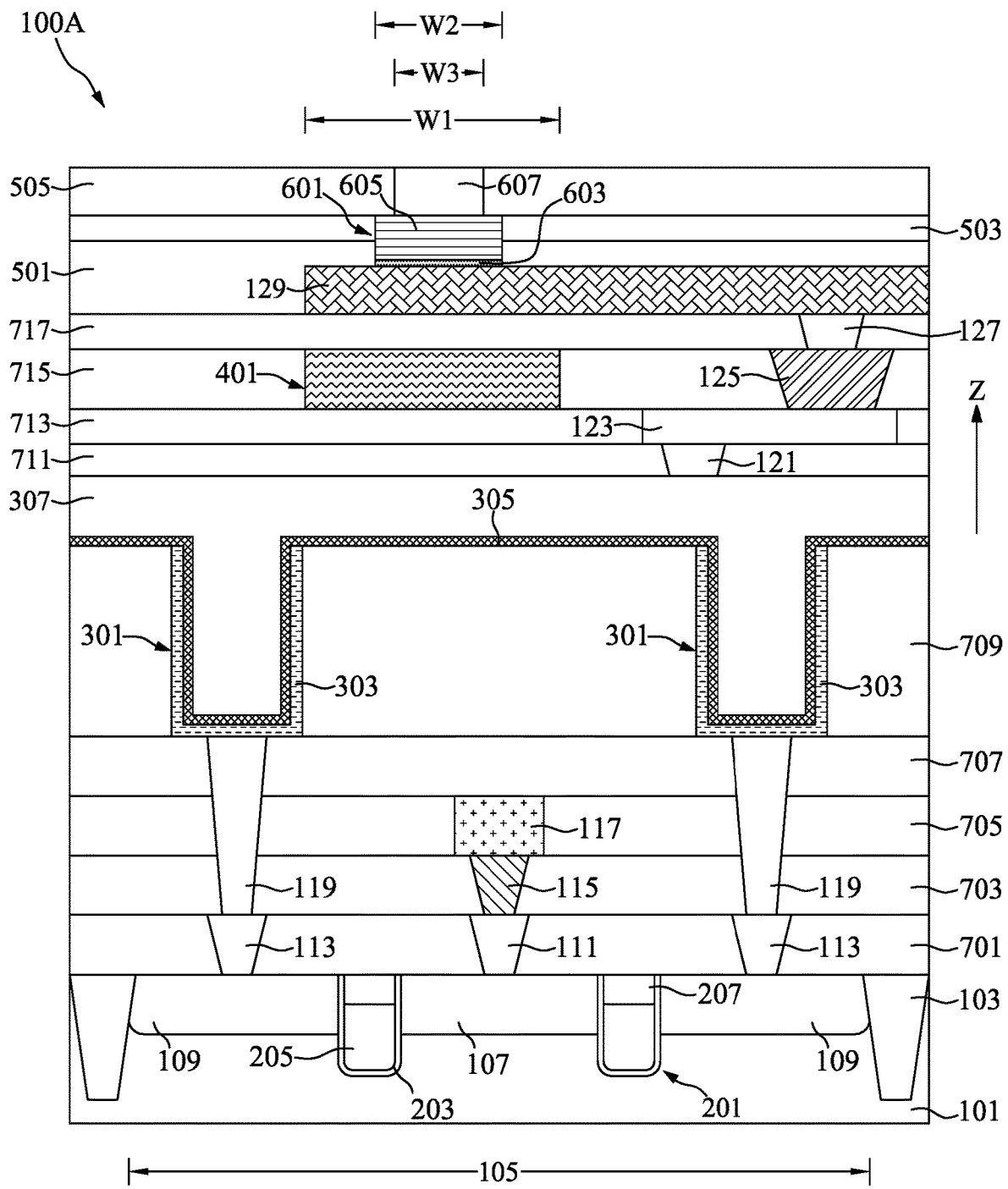
FIG. 1 illustrates, in a schematic cross-sectional view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 2:
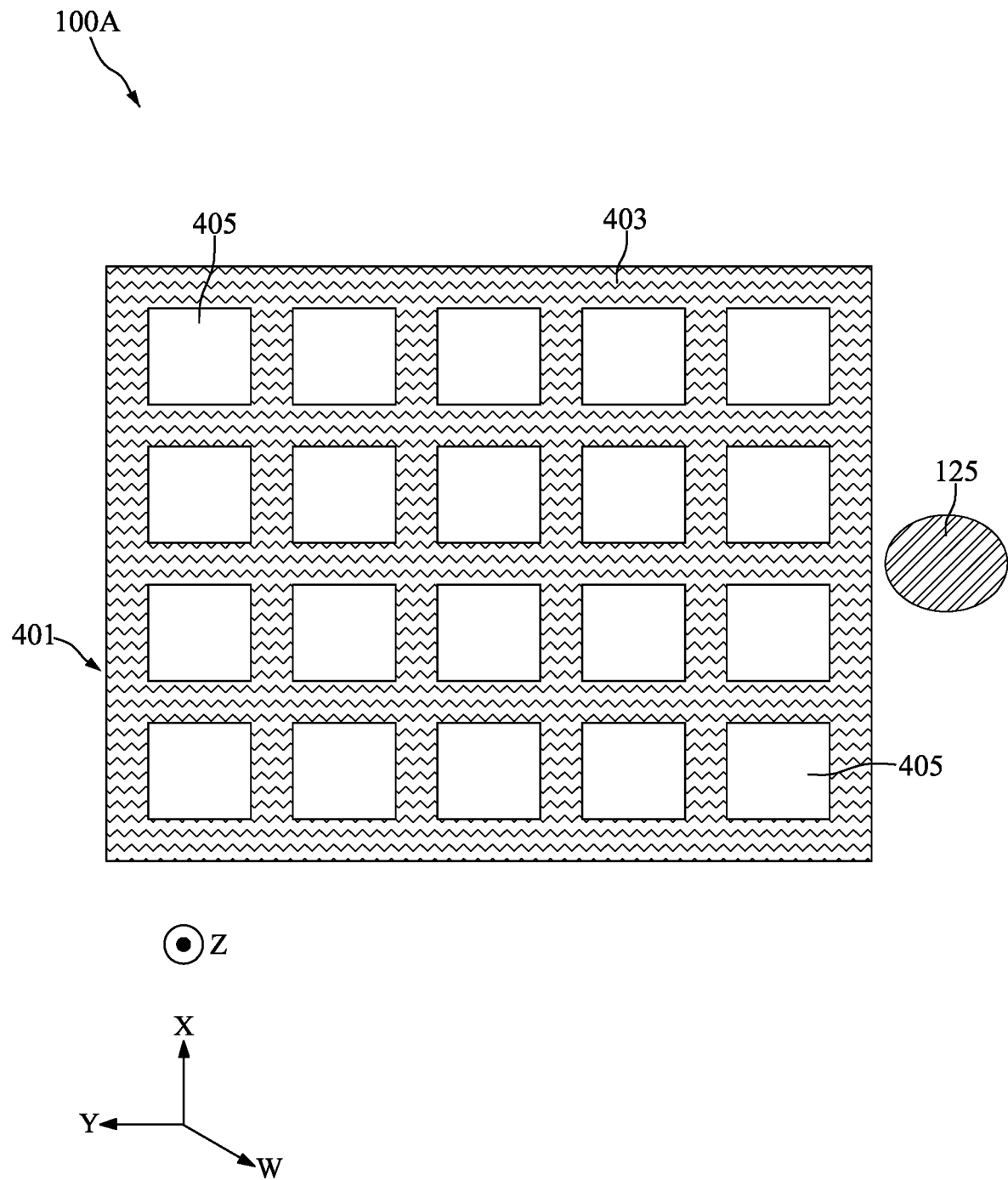
FIG. 2 illustrates, in a schematic top-view diagram, the semiconductor device in accordance with FIG. 1.
Figure 3:
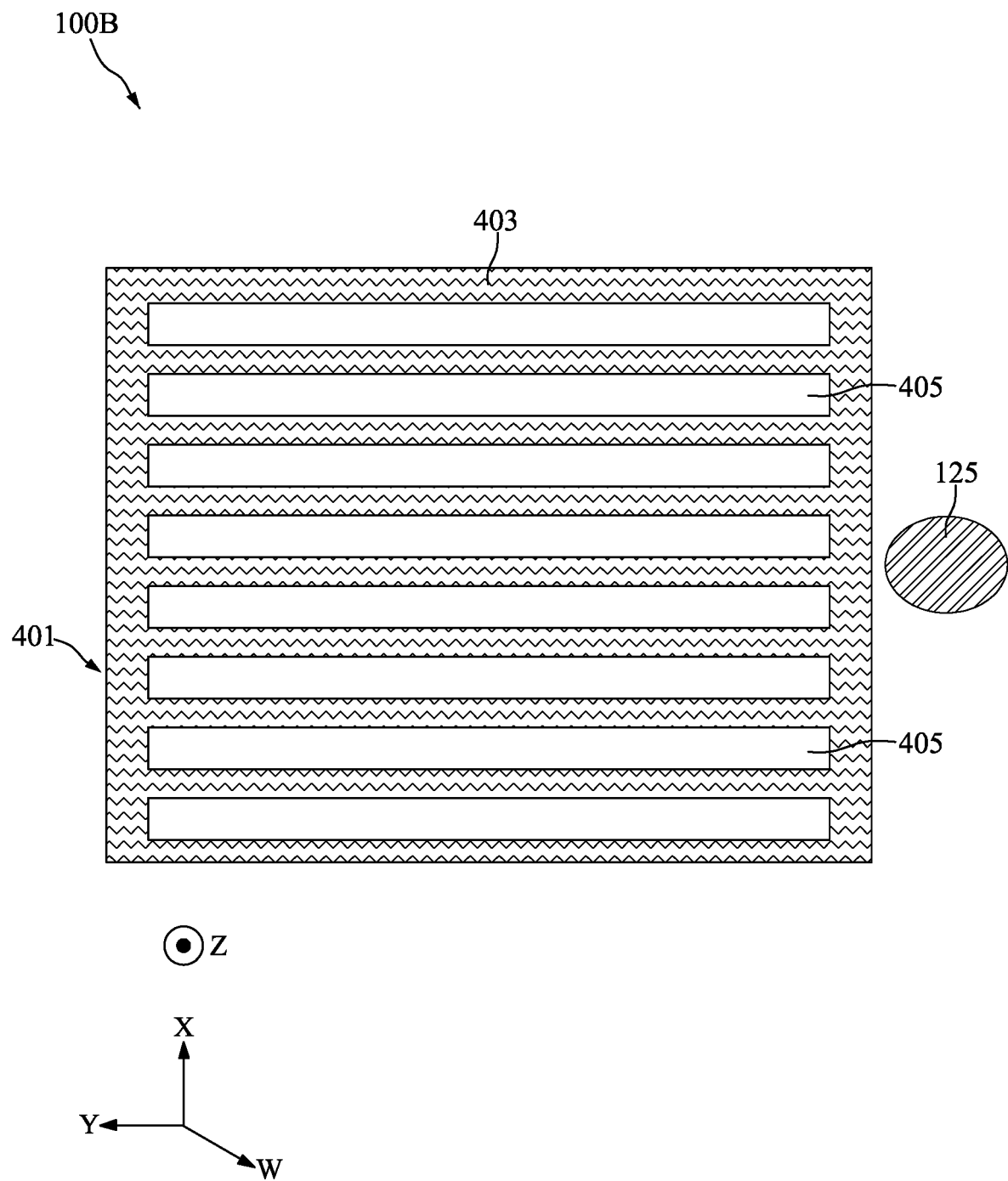
FIGS. 3 to 5 illustrate, in schematic top-view diagrams, semiconductor devices in accordance with some other embodiments of the present disclosure.
Figure 4:
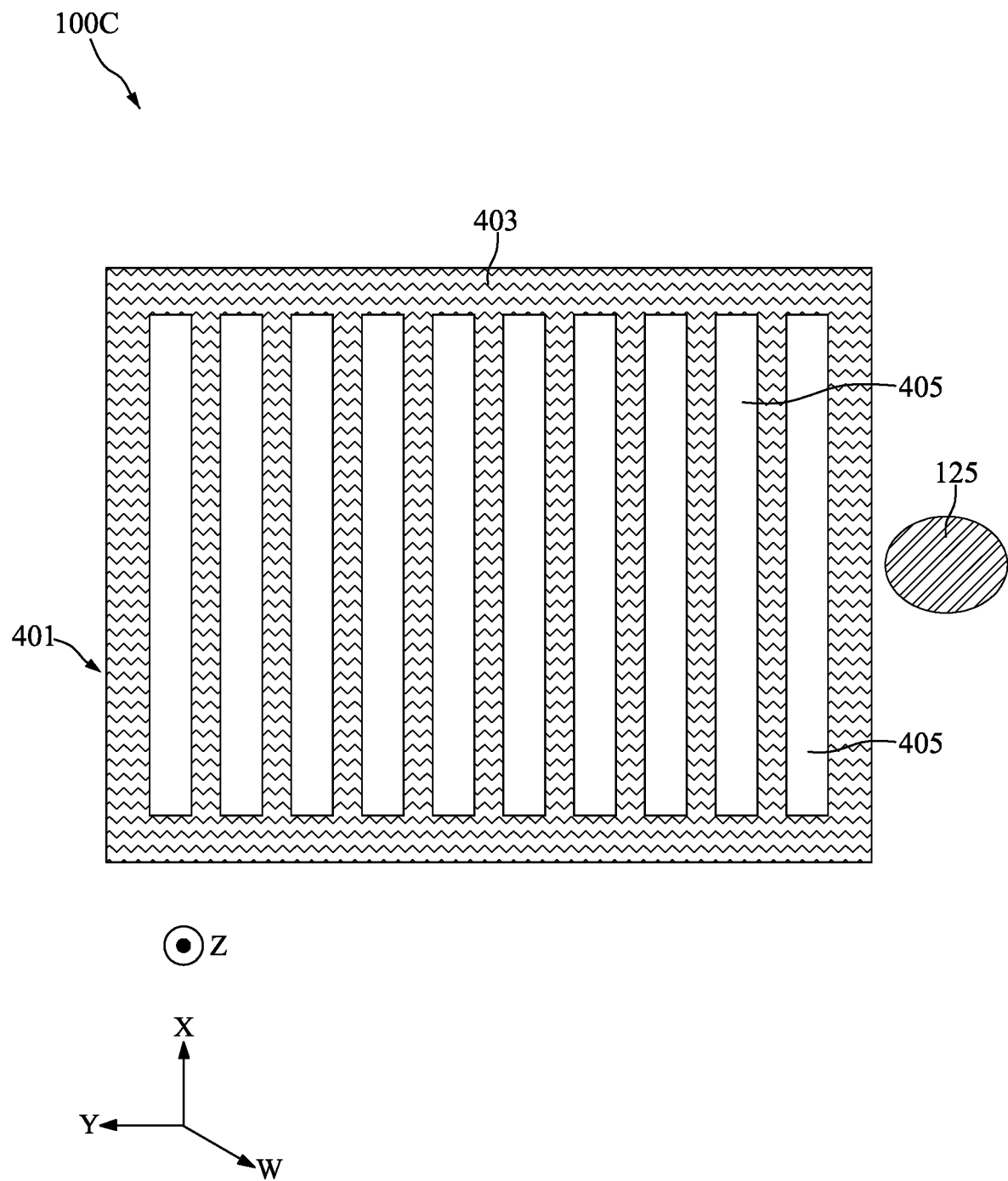
Figure 5:
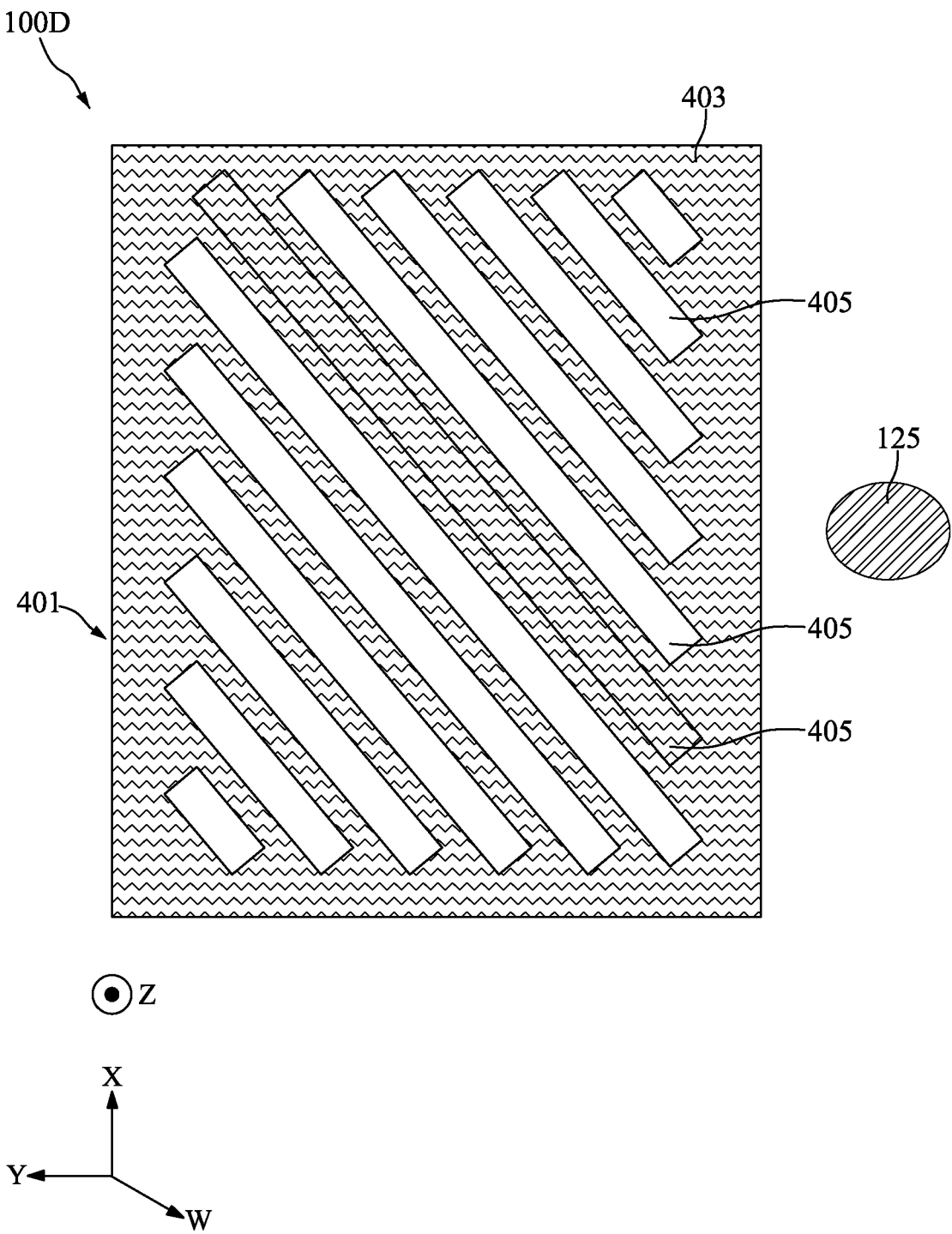

FIG. 1 illustrates, in a schematic cross-sectional view diagram, a semiconductor device 100A in accordance with one embodiment of the present disclosure. FIG. 2 illustrates, in a schematic top-view diagram, the semiconductor device 100A in accordance with FIG. 1. FIGS. 3 to 5 illustrate, in schematic top-view diagrams, semiconductor devices 100B, 100C and 100D in accordance with some other embodiments of the present disclosure. Some elements of the semiconductor device of the present disclosure are not shown in FIGS. 2 to 5 for clarity.

With reference to FIGS. 1 to 2, in the embodiment depicted, the semiconductor device 100A may include a substrate 101, an isolation layer 103, a plurality of doped regions, a plurality of insulating films, a plurality of contacts, a plurality of bit line contacts 115, a plurality of bit lines 117, a plurality of capacitor plugs 119, a first conductive via 121, a first conductive layer 123, an intrinsically conductive pad 125, a redistribution conductive via 127, a redistribution conductive layer 129, a plurality of word lines 201, a plurality of capacitor structures 301, a stress relief structure 401, a plurality of passivation layers, an external bonding structure 601, and a wiring layer 607.

With reference to FIGS. 1 to 2, in the embodiment depicted, the substrate 101 may be formed of, for example, silicon, germanium, silicon germanium, silicon carbon, silicon germanium carbon, gallium, gallium arsenic, indium arsenic, indium phosphorus or other IV-IV, III-V or II-VI semiconductor materials. Alternatively, in another embodiment, the substrate 101 may include an organic semiconductor or a layered semiconductor such as silicon/silicon germanium, silicon-on-insulator or silicon germanium-on-insulator. When the substrate 101 is formed of silicon-on-insulator, the substrate 101 may include a top semiconductor layer and a bottom semiconductor layer formed of silicon, and a buried insulating layer which may separate the top semiconductor layer and the bottom semiconductor layer. The buried insulating layer may include, for example, a crystalline or non-crystalline oxide, nitride or any combination thereof.

With reference to FIGS. 1 to 2, in the embodiment depicted, the isolation layer 103 may be disposed in an upper portion of the substrate 101. (Two isolation layers 103 are shown in the cross-sectional diagram in FIG. 1, but other quantities of isolation layers may be used in other embodiments.) The isolation layer 103 may be formed of, for example, an insulating material such as silicon oxide, silicon nitride, silicon oxynitride, silicon nitride oxide, or fluoride-doped silicate. The isolation layer 103 may define a plurality of active regions 105 of the substrate 101.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 1 to 2, in the embodiment depicted, the plurality of word lines 201 may be disposed in the upper portion of the substrate 101 and separated from each other. Each of the plurality of active regions 105 may intersect two of the plurality of word lines 201. The plurality of word lines 201 may include a plurality of word line insulating layers 203, a plurality of word line conductive layers 205, and a plurality of word line capping layers 207.

With reference to FIGS. 1 and 2, in the embodiment depicted, the plurality of word line insulating layers 203 may be inwardly disposed in the upper portion of the substrate 101. The plurality of word line insulating layers 203 may have a thickness between about 0.5 nm and about 10 nm. Bottoms of the plurality of word line insulating layers 203 may be flat. The plurality of word line insulating layers 203 may be formed of, for example, an insulating material having a dielectric constant of about 4.0 or greater. (All dielectric constants mentioned herein are relative to a vacuum unless otherwise noted.) The insulating material having a dielectric constant of about 4.0 or greater may be hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, barium strontium titanate, or a mixture thereof. Alternatively, in another embodiment, the insulating material may be silicon oxide, silicon nitride, silicon oxynitride, silicon nitride oxide, or the like.

With reference to FIGS. 1 and 2, in the embodiment depicted, the plurality of word line conductive layers 205 may be respectively correspondingly disposed on the plurality of word line insulating layers 203. The plurality of word line conductive layers 205 may be formed of, for example, a conductive material such as doped polysilicon, silicon germanium, metal, metal alloy, metal silicide, metal nitride, metal carbide, or a combination including multilayers thereof. The metal may be aluminum, copper, tungsten, or cobalt. The metal silicide may be nickel silicide, platinum silicide, titanium silicide, molybdenum silicide, cobalt silicide, tantalum silicide, tungsten silicide, or the like. The plurality of word line conductive layers 205 may have a thickness between about 50 nm and about 500 nm.

With reference to FIGS. 1 and 2, in the embodiment depicted, the plurality of word line capping layers 207 may be respectively correspondingly disposed on the plurality of word line conductive layers 205. Top surfaces of the plurality of word line capping layers 207 may be even with a top surface of the substrate 101. The plurality of word line capping layers 207 may be formed of, for example, an insulating material having a dielectric constant of about 4.0 or greater.

With reference to FIGS. 1 to 2, in the embodiment depicted, the plurality of doped regions may be disposed in the upper portion of the substrate 101. The plurality of doped regions may be doped with a dopant such as phosphorus, arsenic, antimony, or boron. The plurality of doped regions may include a first doped region 107 and two second doped regions 109. The first doped region 107 may be disposed between the two of the plurality of word lines 201. The two second doped regions 109 may be respectively correspondingly disposed between the plurality of word lines 201 and the isolation layer 103.

With reference to FIGS. 1 to 2, in the embodiment depicted, the plurality of insulating films may be disposed on the substrate 101. The plurality of insulating films may be formed of, for example, silicon nitride, silicon oxide, silicon oxynitride, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, xerogel, aerogel, amorphous fluorinated carbon, organo silicate glass, parylene, bis-benzocyclobutenes, polyimide, porous polymeric material, or a combination thereof, but are not limited thereto. The plurality of insulating films may be all formed of a same material but are not limited thereto. The plurality of insulating films may include a first insulating film 701, a second insulating film 703, a third insulating film 705, a fourth insulating film 707, a fifth insulating film 709, a sixth insulating film 711, a seventh insulating film 713, an eighth insulating film 715, and a ninth insulating film 717.

With reference to FIGS. 1 to 2, in the embodiment depicted, the first insulating film 701 may be disposed on the substrate 101. The plurality of contacts may be disposed in the first insulating film 701. For each of the plurality of active regions 105, the plurality of contacts may include a first contact 111 and two second contacts 113. The first contact 111 may be disposed on the first doped region 107 and electrically connected to the first doped region 107. The two second contacts 113 may be respectively correspondingly disposed on the two second doped regions 109 and electrically connected to the two second doped regions 109. The first contact 111 and the two second contacts 113 may be formed of a conductive material such as doped polysilicon, metal, metal nitride, or metal silicide.

With reference to FIGS. 1 and 2, in the embodiment depicted, the second insulating film 703 may be disposed on the first insulating film 701. The plurality of bit line contacts 115 may be disposed in the second insulating film 703 and in the plurality of active regions 105. (Only one bit line contact 115 is shown in the cross-sectional diagram in FIG. 1.) For each of the plurality of active regions 105, the bit line contact 115 may be disposed on the first contact 111 and electrically connected to the first contact 111. The plurality of bit line contacts 115 may be formed of a same material as the first contact 111, but are not limited thereto.

With reference to FIGS. 1 and 2, in the embodiment depicted, the third insulating film 705 may be disposed on the second insulating film 703. The plurality of bit lines 117 may be disposed in the third insulating film 705. (Only one bit line 117 is shown in the cross-sectional diagram in FIG. 1.) For each of the plurality of active regions 105, the bit line 117 may be disposed on the corresponding bit line contact 115 and electrically connected to the corresponding bit line contact 115. The plurality of bit lines 117 may be formed of a conductive material such as tungsten, aluminum, copper, nickel, or cobalt.

With reference to FIGS. 1 and 2, in the embodiment depicted, the fourth insulating film 707 may be disposed on the third insulating film 705. The plurality of capacitor plugs 119 may be disposed so as to penetrate through the fourth insulating film 707, the third insulating film 705, and the second insulating film 703. For each of the plurality of active regions 105, two of the plurality of capacitor plugs 119 may be respectively correspondingly disposed on the two second contacts 113 and electrically connected to the two second contacts 113. The plurality of capacitor plugs 119 may be formed of doped polysilicon, titanium, titanium nitride, tantalum, tantalum nitride, tungsten, copper, aluminum or aluminum alloy.

With reference to FIGS. 1 to 2, in the embodiment depicted, the fifth insulating film 709 may be disposed on the fourth insulating film 707. The plurality of capacitor structures 301 may be disposed in the fifth insulating film 709 and respectively correspondingly on the plurality of capacitor plugs 119. The plurality of capacitor structures 301 may be electrically connected to the plurality of capacitor plugs 119. The plurality of capacitor structures 301 may include a plurality of capacitor bottom electrodes 303, a capacitor insulating layer 305, and a capacitor top electrode 307. The plurality of capacitor bottom electrodes 303 may be inwardly disposed in the fifth insulating film 709. Bottoms of the plurality of capacitor bottom electrodes 303 may directly contact top surfaces of the plurality of capacitor plugs 119. The plurality of capacitor bottom electrodes 303 may be formed of doped polysilicon, metal, or metal silicide.

With reference to FIGS. 1 and 2, in the embodiment depicted, the capacitor insulating layer 305 may be disposed on the plurality of capacitor bottom electrodes 303. The capacitor insulating layer 305 may be formed of a single layer including an insulating material having a dielectric constant of about 4.0 or greater. The capacitor insulating layer 305 may have a thickness between about 1 angstrom and about 100 angstroms. Alternatively, in another embodiment, the capacitor insulating layer 305 may be formed of a stacked layer consisting of silicon oxide, silicon nitride, and silicon oxide. The capacitor top electrode 307 may be disposed on the capacitor insulating layer 305. The capacitor top electrode 307 may be formed of doped polysilicon or metal.

With reference to FIGS. 1 to 2, in the embodiment depicted, the sixth insulating film 711 may be disposed on the capacitor top electrode 307. The seventh insulating film 713 may be disposed on the sixth insulating film 711. The eighth insulating film 715 may be disposed on the seventh insulating film 713. The ninth insulating film 717 may be disposed on the eighth insulating film 715. The first conductive via 121 may be disposed in the sixth insulating film 711 and on the capacitor top electrode 307. The first conductive via 121 may be electrically connected to the capacitor top electrode 307. The first conductive via 121 may be formed of, for example, metal, metal alloy, silicate, silicide, polysilicon, amorphous silicon, or any other semiconductor-compatible conductive material. The first conductive layer 123 may be disposed in the seventh insulating film 713 and on the first conductive via 121. The first conductive layer 123 may be electrically connected to the first conductive via 121. The first conductive layer 123 may be formed of, for example, a conductive material such as doped polysilicon, metal, metal nitride, or metal silicide.

With reference to FIGS. 1 to 2, in the embodiment depicted, an intrinsically conductive pad 125 may be disposed in the eighth insulating film 715 and on the first conductive layer 123. The intrinsically conductive pad 125 may be electrically connected to the first conductive layer 123 and electrically coupled to the plurality of capacitor structures 301. The intrinsically conductive pad 125 may be formed of, for example, aluminum or copper. Alternatively, in another embodiment, the intrinsically conductive pad 125 may be formed of a stacked layer consisting of gold, nickel, and copper.

It should be noted that the first conductive via 121 and the first conductive layer 123 in the embodiment are shown for illustrative purpose only and are not limiting. There could be other numbers of conductive vias or conductive lines, such as a second conductive via or a second conductive line, disposed among other numbers of insulating films to electrically couple the intrinsically conductive pad 125, and other numbers of capacitor structures 301 are also possible.

With reference to FIGS. 1 to 2, in the embodiment depicted, the stress relief structure 401 may be disposed in the eighth insulating film 715 and distant from the intrinsically conductive pad 125. The stress relief structure 401 may include a conductive frame 403 and a plurality of insulating segments 405. The conductive frame 403 may be disposed distant from the intrinsically conductive pad 125 and may have a mesh shape. That is, members of the conductive frame 403 may be connected to each other. The conductive frame 403 may be formed of, for example, a conductive material such as metal, metal nitride, or metal silicide. The plurality of insulating segments 405 may be disposed within the conductive frame 403 and may have a square shape. The plurality of insulating segments 405 may be formed of a same material as the eighth insulating film 715, but are not limited thereto. Alternatively, in another embodiment, the plurality of insulating segments 405 may be formed of a material including polyimide or an epoxy-based material.

With reference to FIGS. 1 to 2, in the embodiment depicted, the redistribution conductive via 127 may be disposed in the ninth insulating film 717 and on the intrinsically conductive pad 125. The redistribution conductive via 127 may be electrically connected to the intrinsically conductive pad 125. The redistribution conductive via 127 may be formed of a same material as the first conductive via 121, but is not limited thereto. The redistribution conductive layer 129 may be disposed on the ninth insulating film 717. The redistribution conductive layer 129 may be disposed above the intrinsically conductive pad 125 and the stress relief structure 401. The redistribution conductive layer 129 may be formed of, for example, tin, nickel, copper, gold, aluminum, or an alloy thereof. The redistribution conductive layer 129 may be electrically connected to the redistribution conductive via 127 and electrically coupled to the intrinsically conductive pad 125.

With reference to FIGS. 1 to 2, in the embodiment depicted, the plurality of passivation layers may be disposed on the redistribution conductive layer 129 and on the ninth insulating film 717. The plurality of passivation layers may include a first passivation layer 501, a second passivation layer 503, and a third passivation layer 505. The first passivation layer 501 may be disposed on the ninth insulating film 717 and the redistribution conductive layer 129. The first passivation layer 501 may be formed of, for example, silicon oxide or phosphosilica glass. The second passivation layer 503 may be disposed on the first passivation layer 501 and formed of, for example, silicon nitride, silicon oxynitride, or silicon oxide nitride. The first passivation layer 501 may serve as a stress buffer between the second passivation layer 503 and the ninth insulating film 717. The second passivation layer 503 may serve as a high vapor barrier in order to prevent moisture from entering from above. The third passivation layer 505 may be disposed on the second passivation layer 503 and formed of, for example, polyimide or polyamide. The third passivation layer 505 may prevent the layers below the third passivation layer 505 from receiving mechanical scratches or background radiation.

With reference to FIGS. 1 to 2, in the embodiment depicted, the external bonding structure 601 may be disposed in the second passivation layer 503 and the first passivation layer 501. The external bonding structure 601 may be disposed on the redistribution conductive layer 129.

The external bonding structure 601 may be disposed directly above the stress relief structure 401 and higher than the intrinsically conductive pad 125. The external bonding structure 601 may be electrically connected to the redistribution conductive layer 129 and electrically coupled to the intrinsically conductive pad 125. The external bonding structure 601 may include a bottom bonding layer 603 and a top bonding layer 605.

With reference to FIGS. 1 to 2, in the embodiment depicted, the bottom bonding layer 603 may be disposed in the first passivation layer 501 and on the redistribution conductive layer 129. The bottom bonding layer 603 may be electrically connected to the redistribution conductive layer 129. A thickness of the bottom bonding layer 603 may be less than a thickness of the first passivation layer 501. The bottom bonding layer 603 may include nickel. The top bonding layer 605 may be disposed in the first passivation layer 501 and the second passivation layer 503. The top bonding layer 605 may be disposed on the bottom bonding layer 603 and electrically connected to the bottom bonding layer 603. A top surface of the top bonding layer 605 may be even with a top surface of the second passivation layer 503. The top bonding layer 605 may include palladium, cobalt, or a combination thereof. A width W1 of the stress relief structure 401 may be greater than a width W2 of the external bonding structure 601.

With reference to FIGS. 1 to 2, in the embodiment depicted, a wiring layer 607 may be disposed in the third passivation layer 505 and on the top bonding layer 605. The wiring layer 607 may be formed of, for example, gold, copper, aluminum, or an alloy thereof. A width W3 of the wiring layer 607 may be less than the width W2 of the external bonding structure 601. A wire or solder bump (not shown) may be disposed on the wiring layer 607 and may electrically connect the semiconductor device to an external circuit.

During a wiring process or a process of forming a solder bump, a stress may be applied to semiconductor device and the stress may cause delamination of the plurality of insulating films. To reduce the effect of the stress of wiring, the redistribution conductive layer 129 may redirect the stress from the intrinsically conductive pad 125 to the wiring layer 607. The stress relief structure 401 directly below the wiring layer 607 and the external bonding structure 601 may serve as a cushion to reduce the stress of wiring and prevent layers underneath the stress relief structure 401 from delaminating. In addition, the members of the conductive frame 403 are connected to each other and may distribute the stress throughout the entire conductive frame 403; therefore, the conductive frame 403 may provide a better stress-buffering capability comparing to a standalone anti-stress structure. Furthermore, the plurality of insulating segments 405 formed of the material including polyimide or the epoxy-based material may be capable of absorbing and distributing the stress to further improve the stress-buffering capability of the stress relief structure 401.

With reference to FIG. 3, the conductive frame 403 may have a shape of a rectangle with parallel, horizontal cross members. The plurality of insulating segments 405 may have a rectangular shape and may be separated from each other. The plurality of insulating segments 405 may extend along a direction Y. With reference to FIG. 4, the conductive frame 403 may have a shape of a rectangle with parallel, vertical cross members. The plurality of insulating segments 405 may have a rectangular shape and may be separated from each other. The plurality of insulating segments 405 may extend along a direction X perpendicular to the direction Y. With reference to FIG. 5, the conductive frame 403 may have a shape of a rectangle with parallel, diagonal cross members. The plurality of insulating segments 405 may have a rectangular shape and be separated from each other. The plurality of insulating segments 405 may extend along a direction W diagonal with respect to the direction X and the direction Y.

Figure 6:
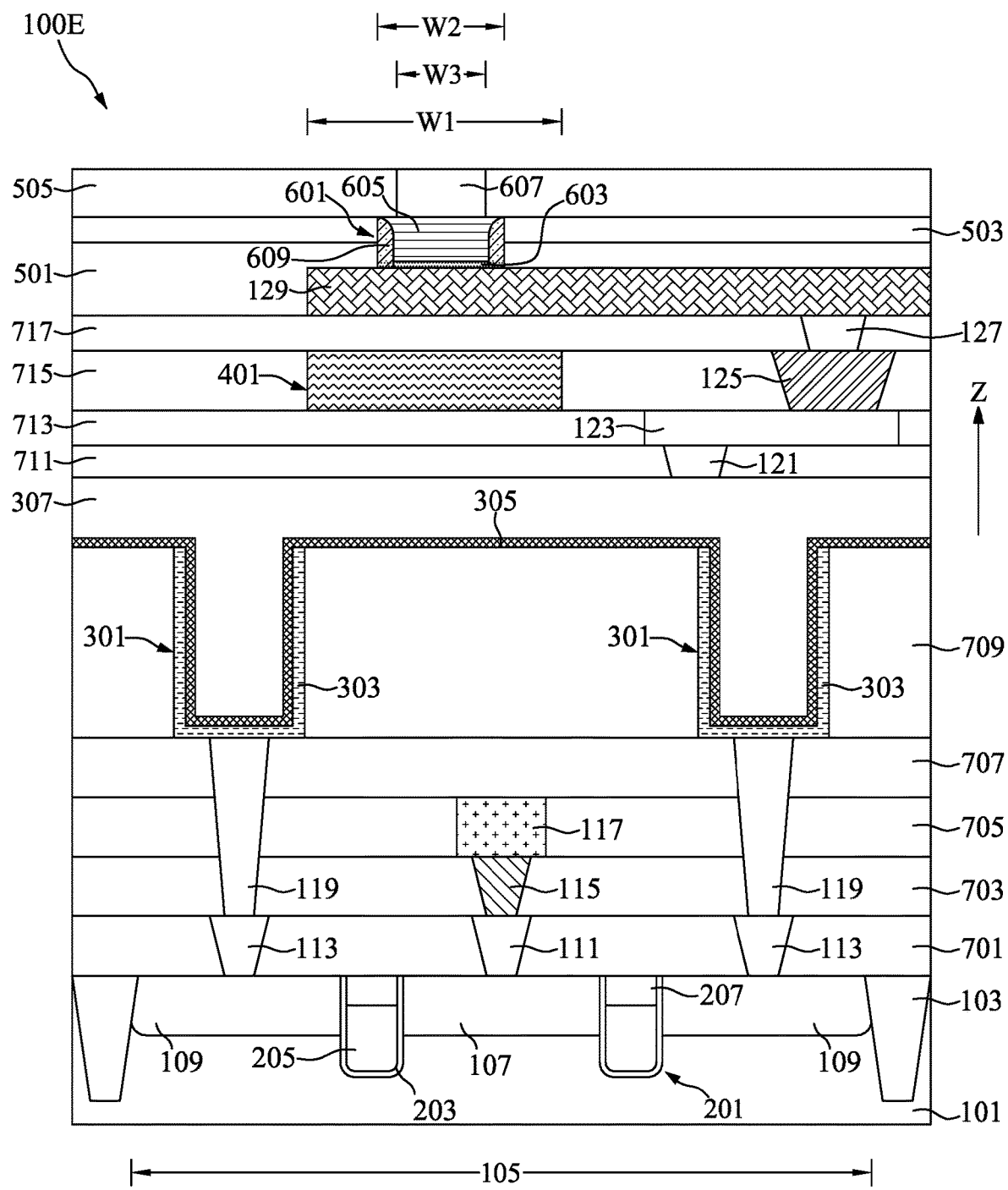
FIGS. 6 to 8 illustrate, in schematic cross-sectional view diagrams, semiconductor devices in accordance with other embodiments of the present disclosure.
Figure 7:
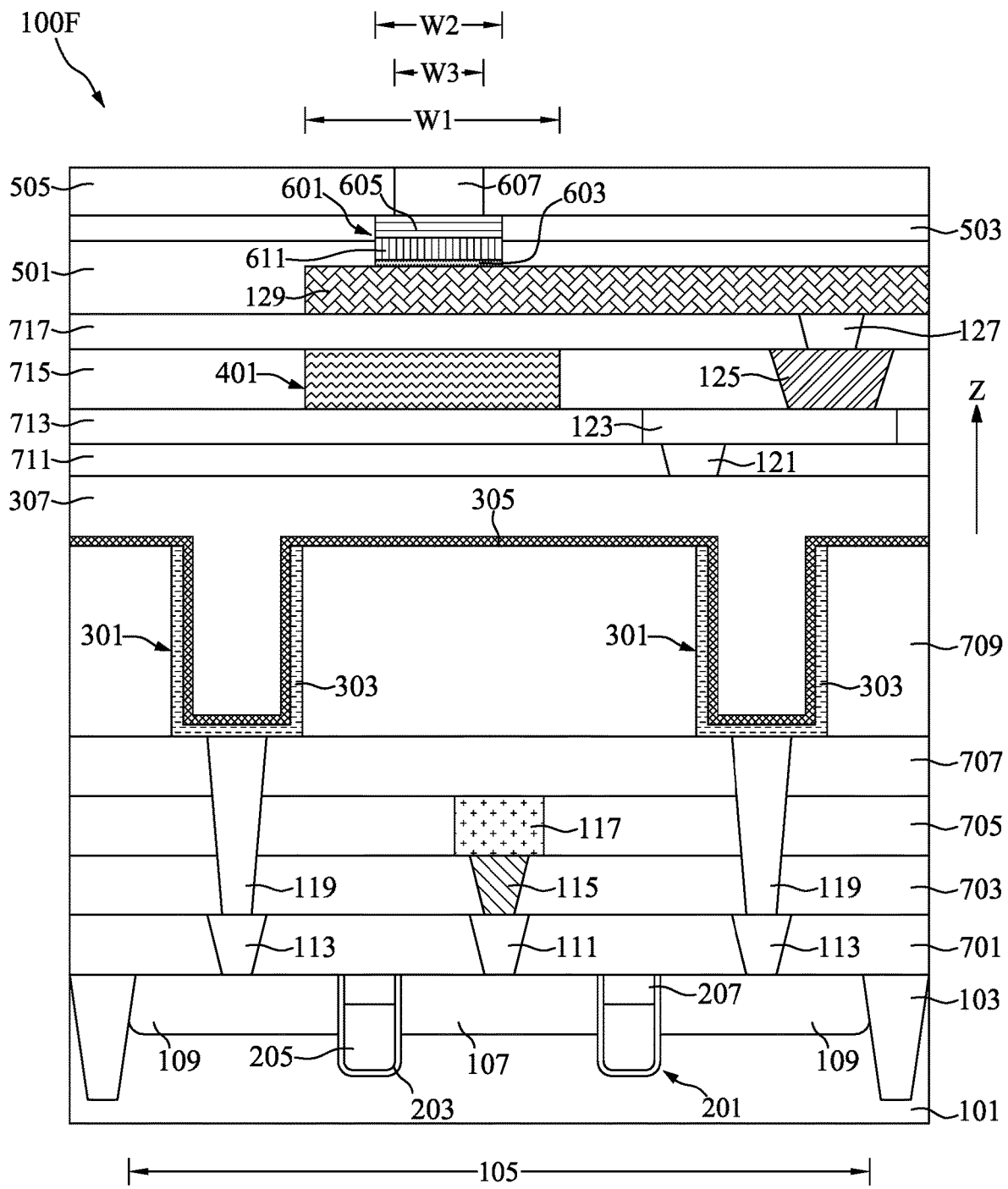
Figure 8:
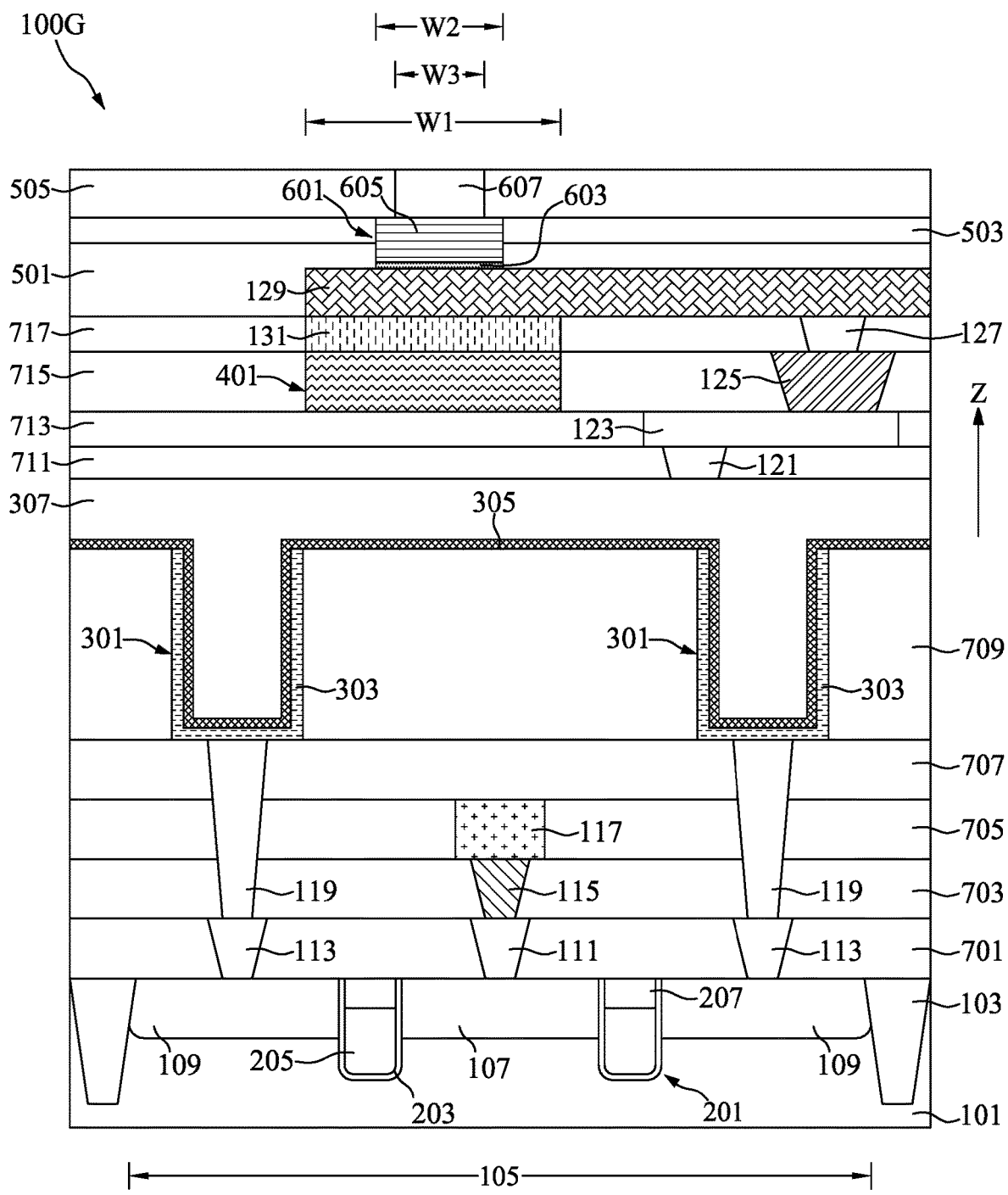

FIGS. 6 to 8 illustrate, in schematic cross-sectional view diagrams, semiconductor devices 100E, 100F and 100G in accordance with other embodiments of the present disclosure.

With reference to FIG. 6, spacers 609 may be attached to two sides of the external bonding structure 601. In other words, the two spacers 609 may be disposed between the external bonding structure 601 and the first passivation layer 501 and the second passivation layer 503. The two spacers 609 may be formed of, for example, silicon oxide.

With reference to FIG. 7, the external bonding structure 601 may include the bottom bonding layer 603, a middle bonding layer 611, and the top bonding layer 605. The middle bonding layer 611 may be disposed on the bottom bonding layer 603. The top bonding layer 605 may be disposed on the middle bonding layer 611. The bottom bonding layer 603 may be formed of, for example, gold. The middle bonding layer 611 may be formed of, for example, nickel. The top bonding layer 605 may be formed of, for example, copper.

With reference to FIG. 8, a stress-buffering layer 131 may be disposed in the ninth insulating film 717 and between the redistribution conductive layer 129 and the stress relief structure 401. The stress-buffering layer 131 may be disposed directly below the external bonding structure 601. The stress-buffering layer 131 may be utilized to absorb and redistribute the stress concentration from the underlying layers created by the shear stresses from thermal expansion mismatches and normal stresses due to wiring processes. The stress-buffering layer 131 may be formed of, for example, a material having a coefficient of thermal expansion of less than about 20 ppm/° C. and a Young's Modulus of less than about 15 GPa. Specifically, the stress-buffering layer 131 may be formed of a material including polyimide or an epoxy-based material. The stress-buffering layer 131 may have a thickness between about 5,000 angstroms and about 100,000 angstroms. Preferably, the thickness of the stress-buffering layer 131 may be between about 10,000 angstroms and about 50,000 angstroms.

Figure 9:
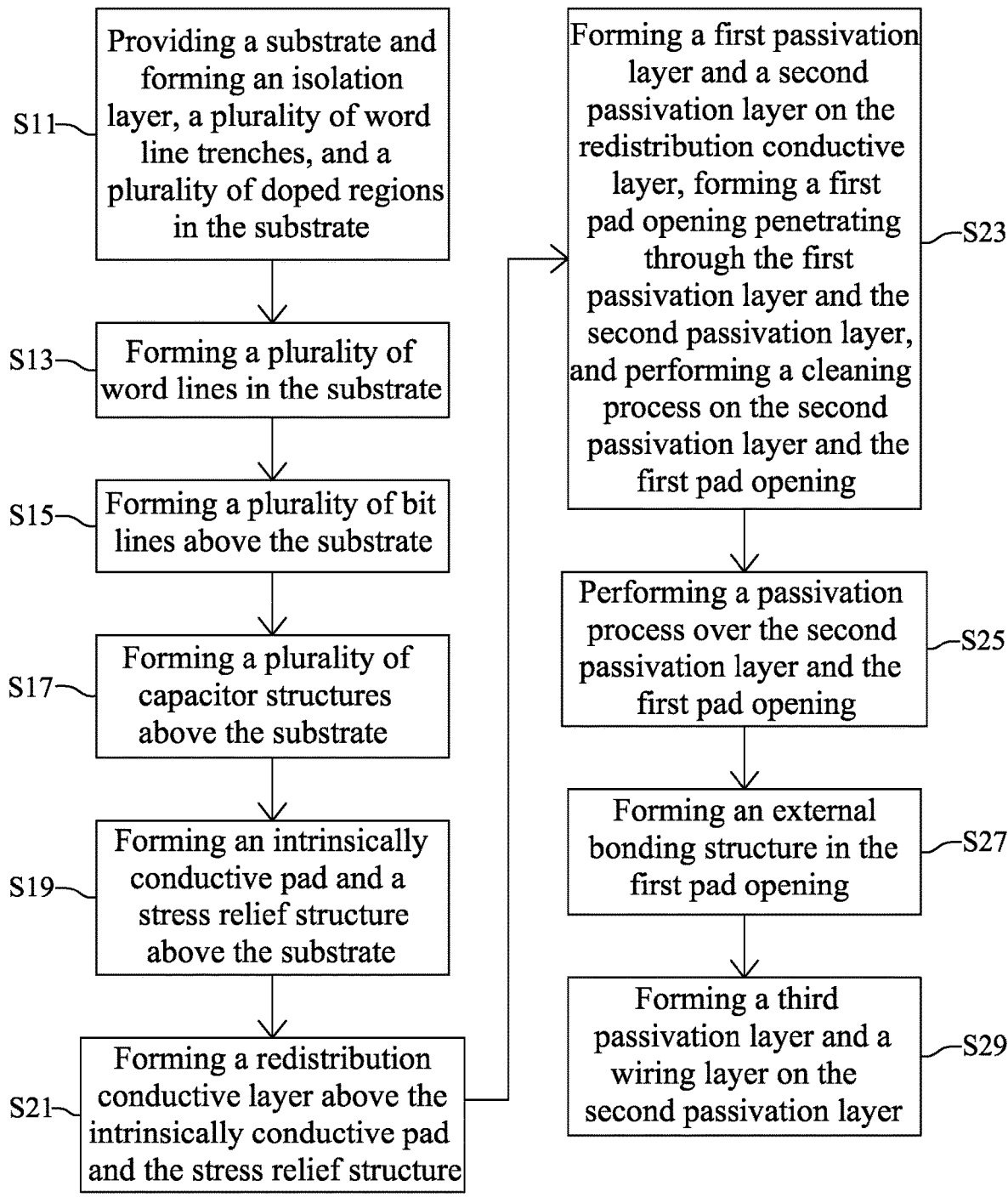
FIG. 9 illustrates, in a flowchart diagram form, a method for fabricating a semiconductor device in accordance with one embodiment of the present disclosure.
Figure 10:
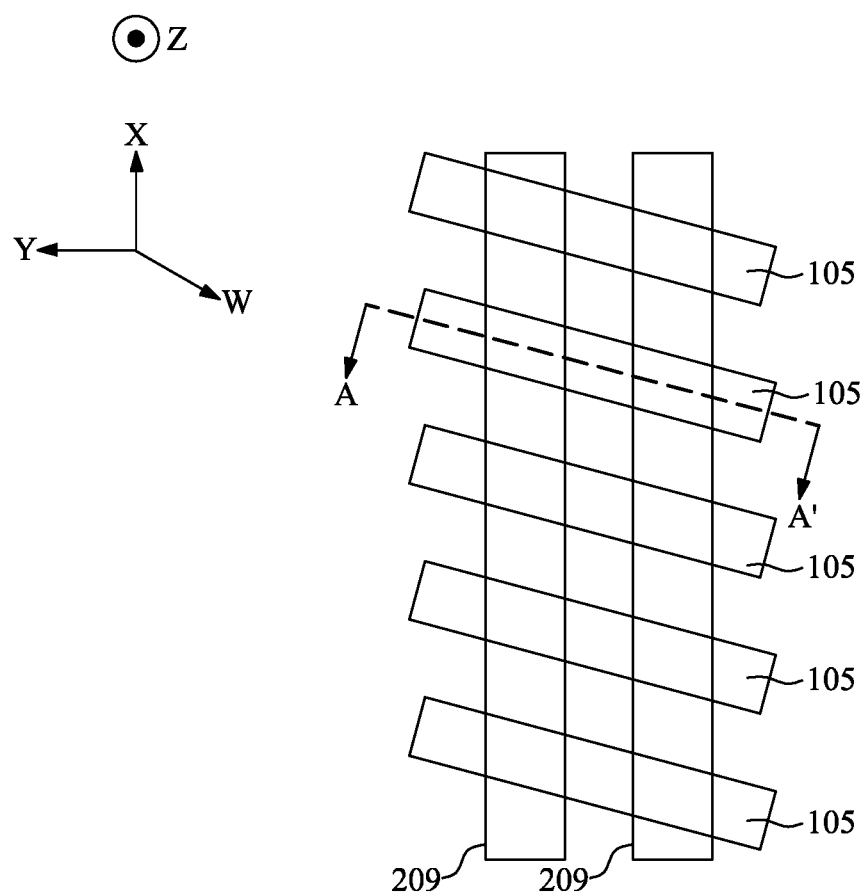
FIG. 10 illustrates, in a schematic top-view diagram, the semiconductor device in accordance with one embodiment of the present disclosure.
Figure 11:
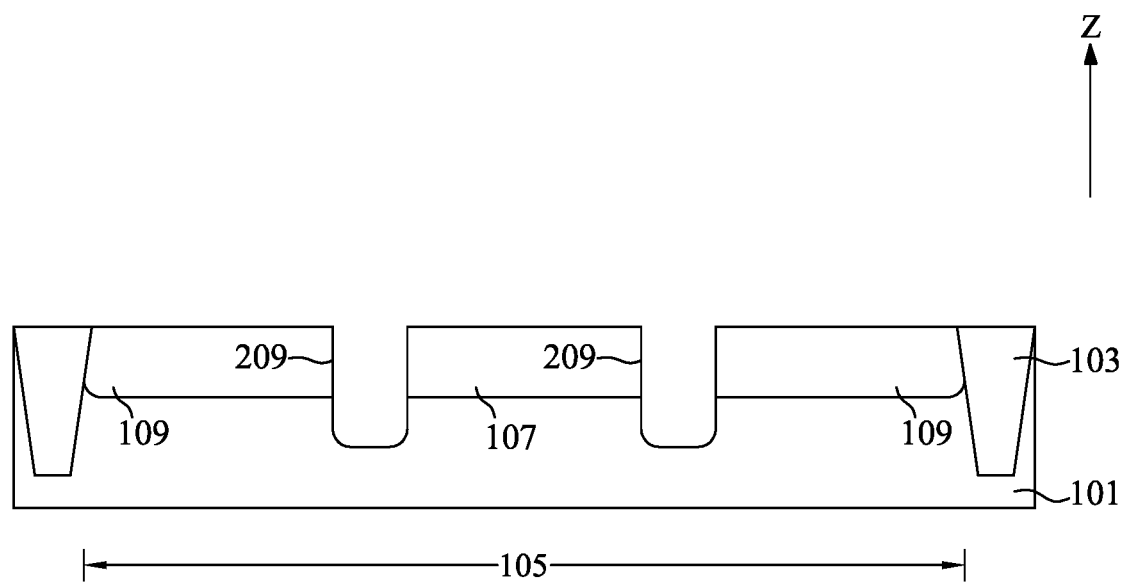
FIG. 11 illustrates, in a schematic cross-sectional diagram taken along a line A-A' in FIG. 10, part of a flow of fabricating a semiconductor device in accordance with one embodiment of the present disclosure.

FIG. 9 illustrates, in a flowchart diagram form, a method 10 for fabricating a semiconductor device 100A in accordance with one embodiment of the present disclosure. FIG. 10 illustrates, in a schematic top-view diagram, the semiconductor device 100A in accordance with one embodiment of the present disclosure. FIG. 11 illustrates, in a schematic cross-sectional diagram taken along a line A-A' in FIG. 10, part of a flow of fabricating the semiconductor device 100A in accordance with one embodiment of the present disclosure. Some elements of the semiconductor device of the present disclosure are not shown in FIG. 10 for clarity.

With reference to FIGS. 9 to 11, at step S11, in the embodiment depicted, a substrate 101 may be provided, and an isolation layer 103, a plurality of word line trenches 209, and a plurality of doped regions may be formed in the substrate 101. The isolation layer 103 may define a plurality of active areas 105. The plurality of active areas 105 may be separated from each other and extend along a direction W in a top-view diagram. The plurality of word line trenches 209 may be inwardly formed in the substrate 101. The plurality of word line trenches 209 may extend along a direction X diagonal with respect to the direction W. Each of the plurality of active regions 105 may intersect two of the plurality of word line trenches 209. The plurality of doped regions may include a first doped region 107 and two second doped regions 109. The first doped region 107 may be formed between the plurality of word line trenches 209. The two second doped regions 109 may be formed between the isolation layer 103 and the plurality of word line trenches 209.

FIGS. 12 to 15 illustrate, in schematic cross-sectional diagrams, part of a flow of fabricating a semiconductor device in accordance with one embodiment of the present disclosure. FIG. 16 illustrates, in a schematic top-view diagram, the semiconductor device in accordance with one embodiment of the present disclosure. FIG. 17 illustrates, in a schematic cross-sectional diagram taken along a line A-A' in FIG. 16, part of a flow of fabricating a semiconductor device in accordance with one embodiment of the present disclosure. Some elements of the semiconductor device of the present disclosure are not shown in FIG. 16 for clarity.

Figure 12:
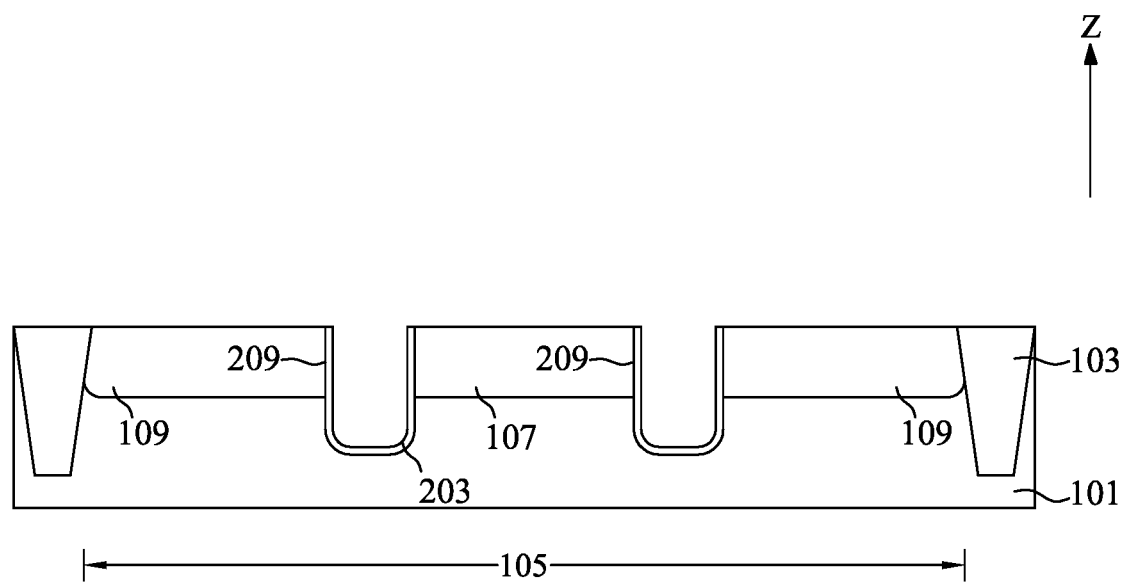
FIGS. 12 to 15 illustrate, in schematic cross-sectional diagrams, part of a flow of fabricating a semiconductor device in accordance with one embodiment of the present disclosure.
Figure 13:
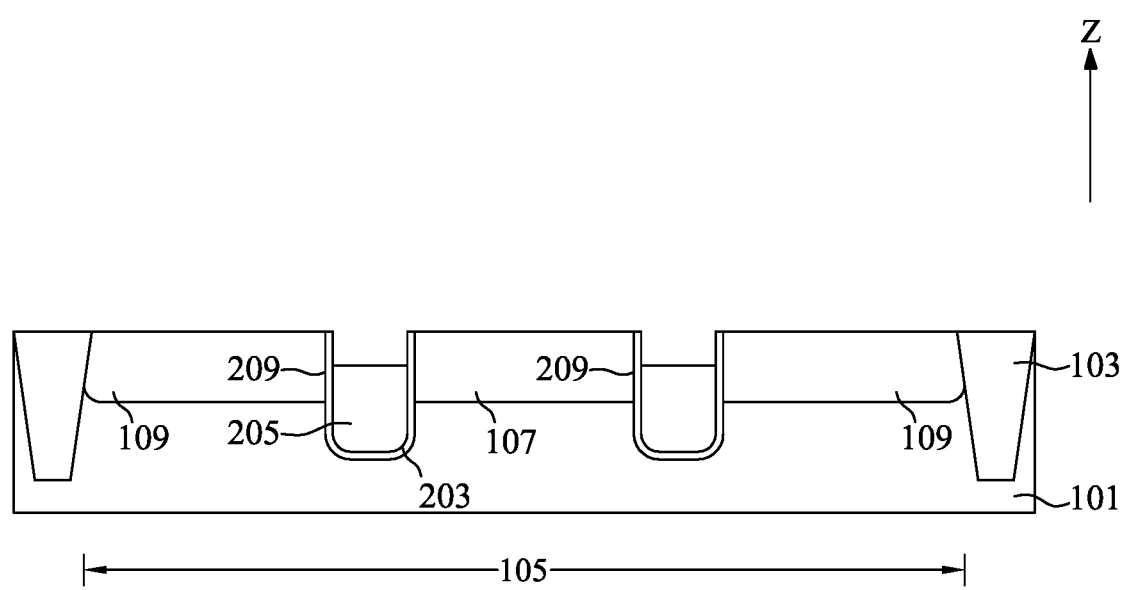
Figure 14:
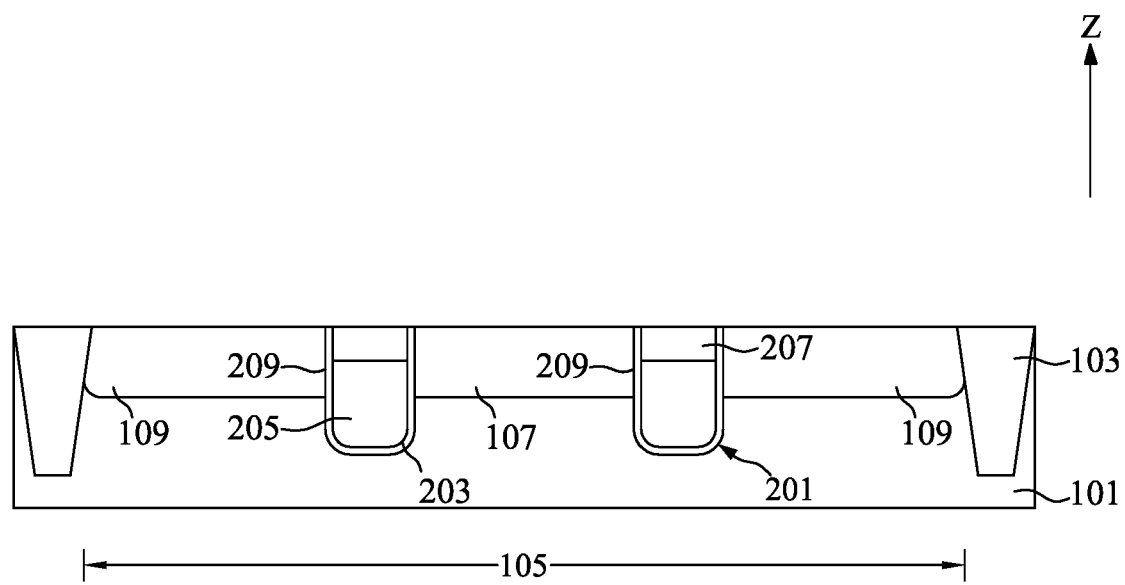

With reference to FIGS. 9 and 12 to 14, at step S13, in the embodiment depicted, a plurality of word lines 201 may be formed in the substrate 101. The plurality of word lines 201 may include a plurality of word line insulating layers 203, a plurality of word line conductive layers 205, and a plurality of word line capping layers 207. With reference to FIG. 12, the plurality of word line insulating layers 203 may be formed in the plurality of word line trenches 209. With reference to FIG. 13, the plurality of word line conductive layers 205 may be respectively correspondingly formed on the plurality of word line insulating layers 203. With reference to FIG. 14, the plurality of word line capping layers 207 may be formed on the plurality of word line conductive layers 205. A planarization process, such as chemical mechanical polishing, may be performed to provide a substantially flat surface for subsequent processing steps.

Figure 15:
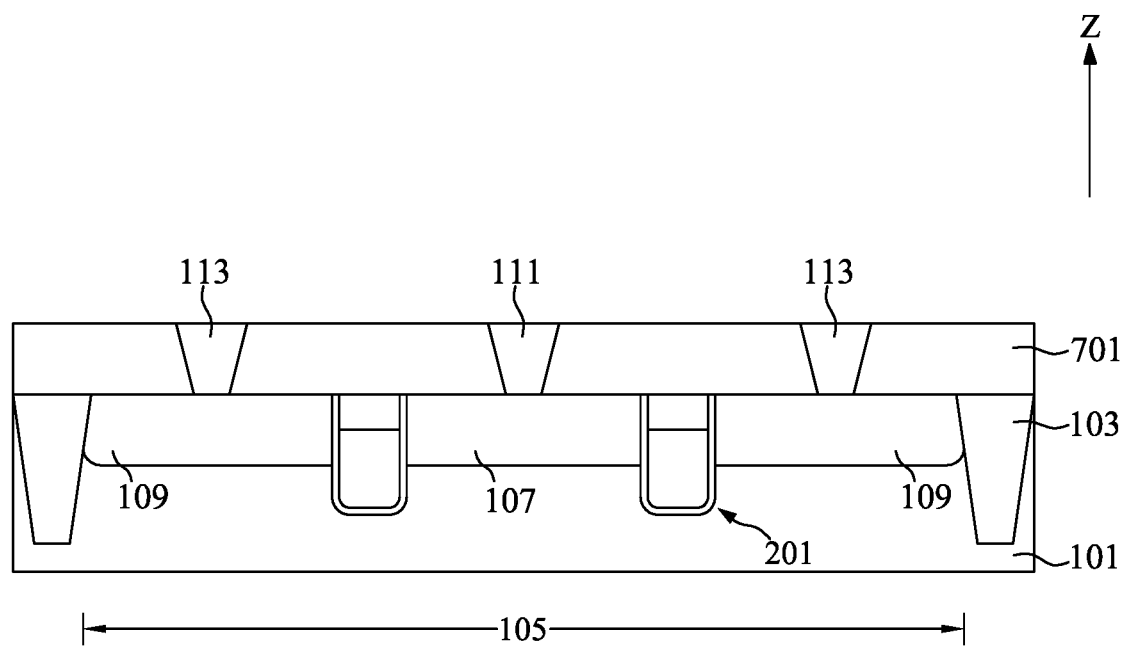
Figure 16:
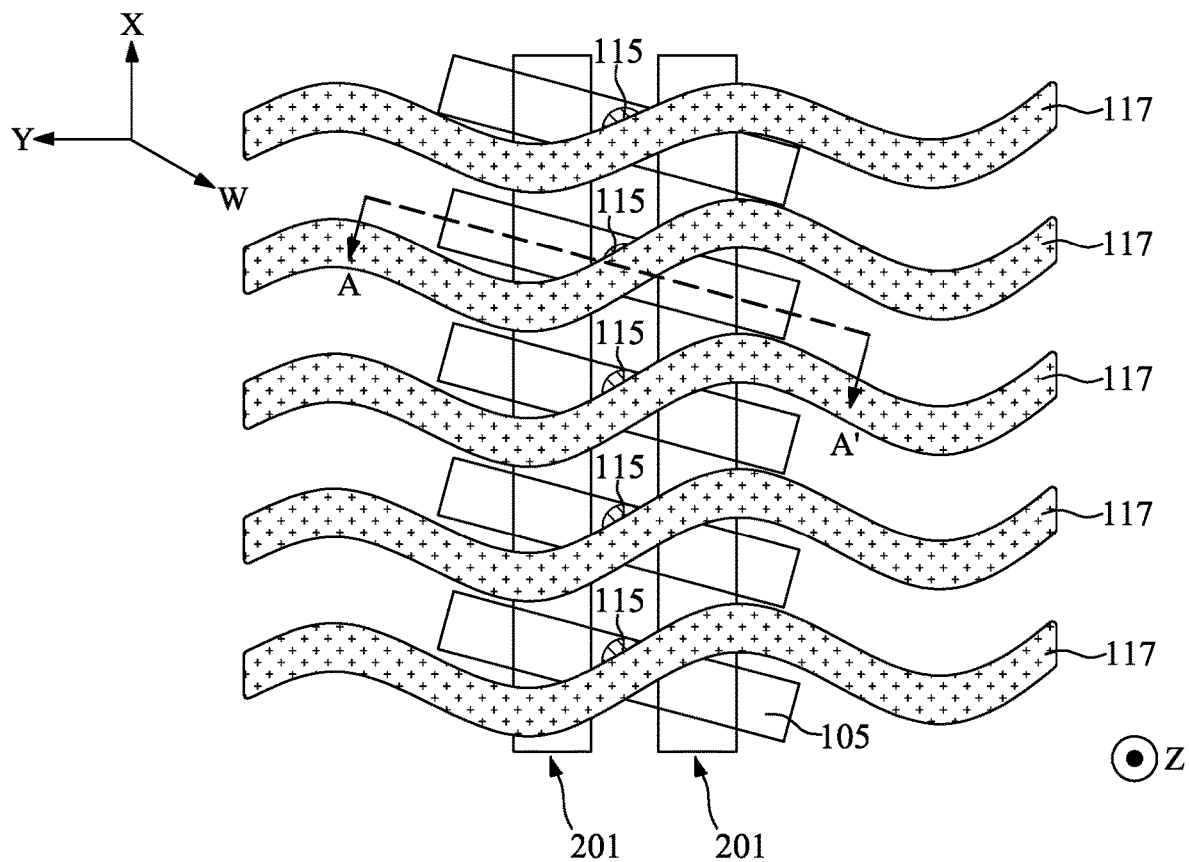
FIG. 16 illustrates, in a schematic top-view diagram, the semiconductor device in accordance with one embodiment of the present disclosure.
Figure 17:
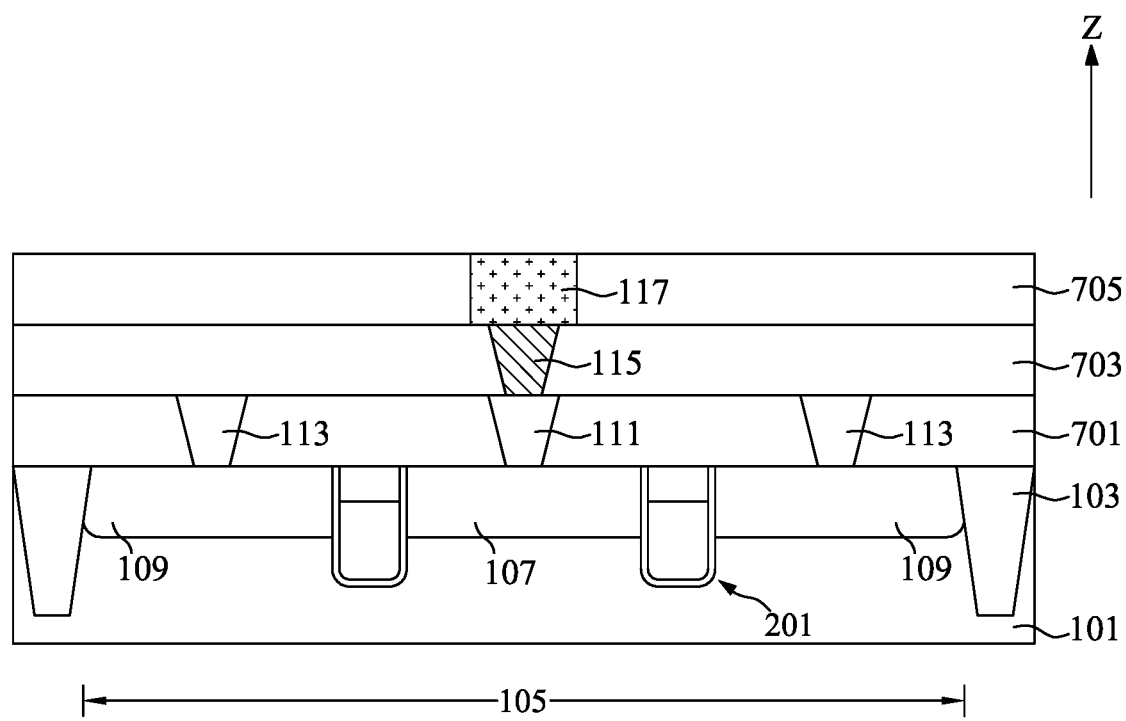
FIG. 17 illustrates, in a schematic cross-sectional diagram taken along a line A-A' in FIG. 16, part of a flow of fabricating a semiconductor device in accordance with one embodiment of the present disclosure.

With reference to FIGS. 9 and 15 to 17, at step S15, in the embodiment depicted, a plurality of bit lines 117 may be formed above the substrate 101. With reference to FIG. 15, a first insulating film 701 may be formed on the substrate 101. For each of the plurality of active regions 105, a first contact 111 and two second contacts 113 may be formed in the first insulating film 701. The first contact 111 may be formed on the first doped region 107. The two second contacts 113 may be respectively correspondingly formed on the two second doped regions 109.

With reference to FIGS. 16 and 17, a second insulating film 703 may be formed on the first insulating film 701. A third insulating film 705 may be formed on the second insulating film 703. A plurality of bit line contacts 115 may be formed in the second insulating film 703. The plurality of bit line contacts 115 may be respectively correspondingly disposed on the plurality of first contacts 111. A plurality of bit lines 117 may be formed in the third insulating film 705. The plurality of bit lines 117 may extend along a direction Y diagonal with respect to the direction W and perpendicular to the direction X. The plurality of bit lines 117 may be implemented as wavy lines. The plurality of bit lines 117 may be separated from each other. Each of the plurality of bit lines 117 may intersect one of the plurality of active regions 105 in a top view diagram. The plurality of bit lines 117 may be electrically connected to the plurality of bit line contacts 115.

Figure 20:
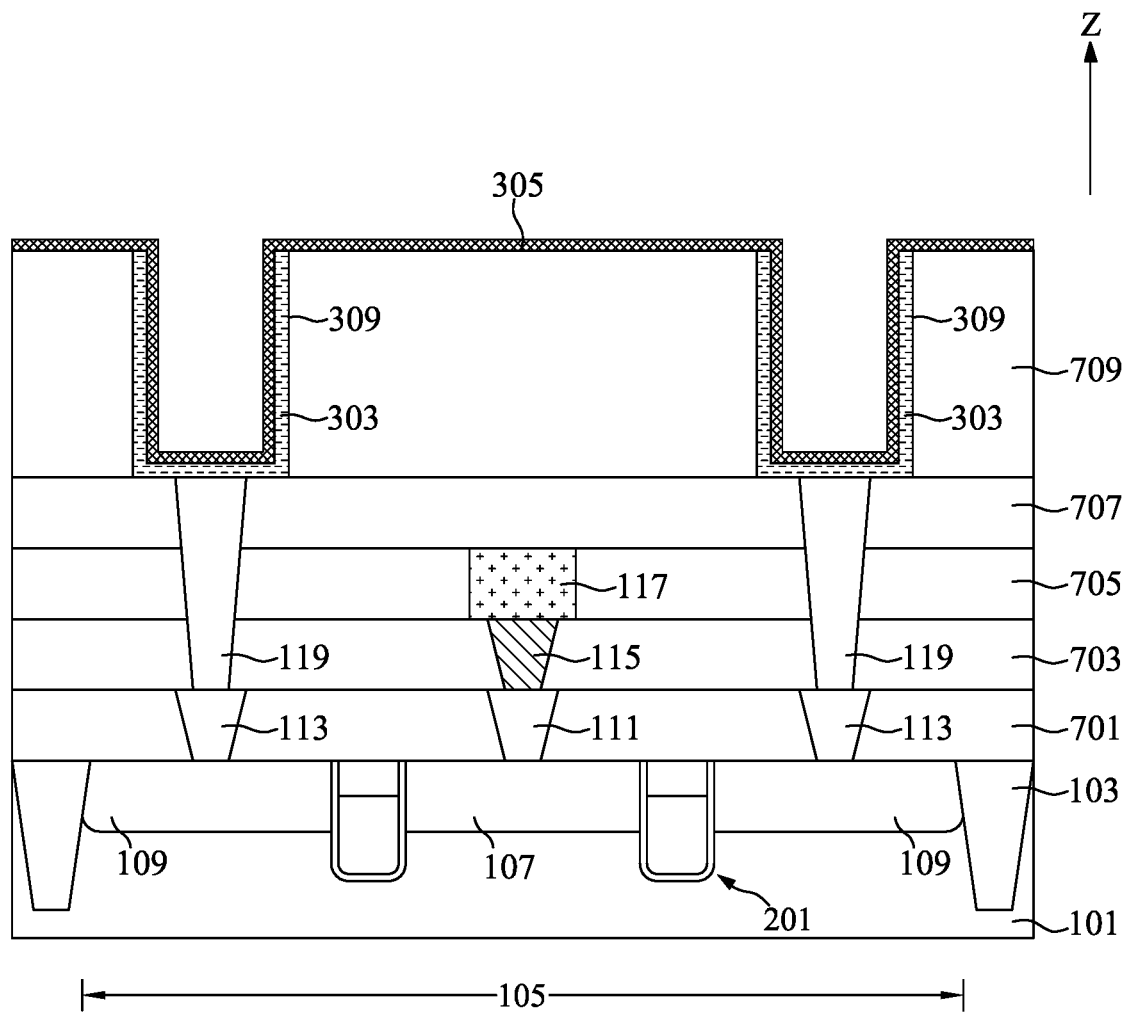
Figure 21:
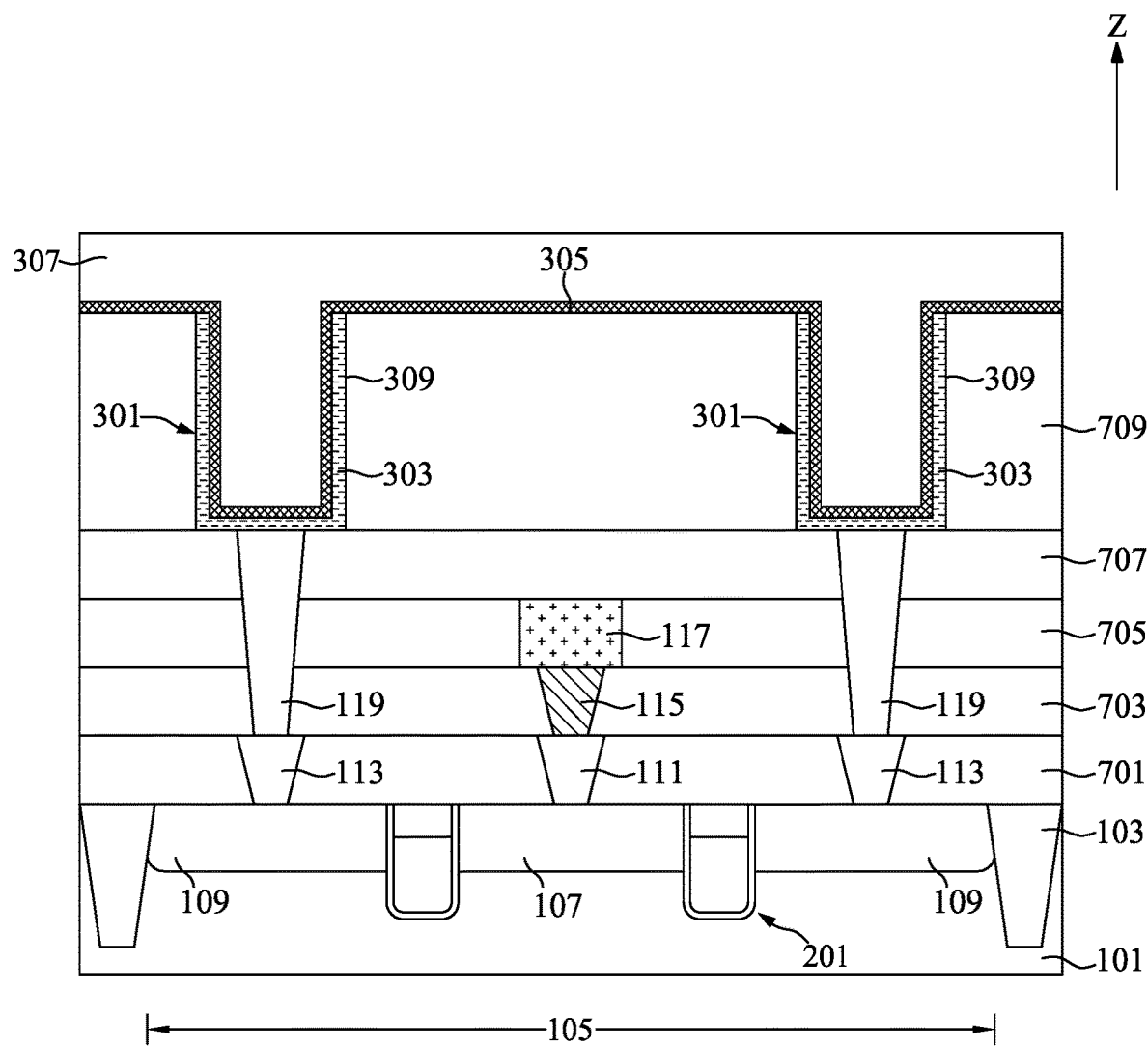
Figure 22:
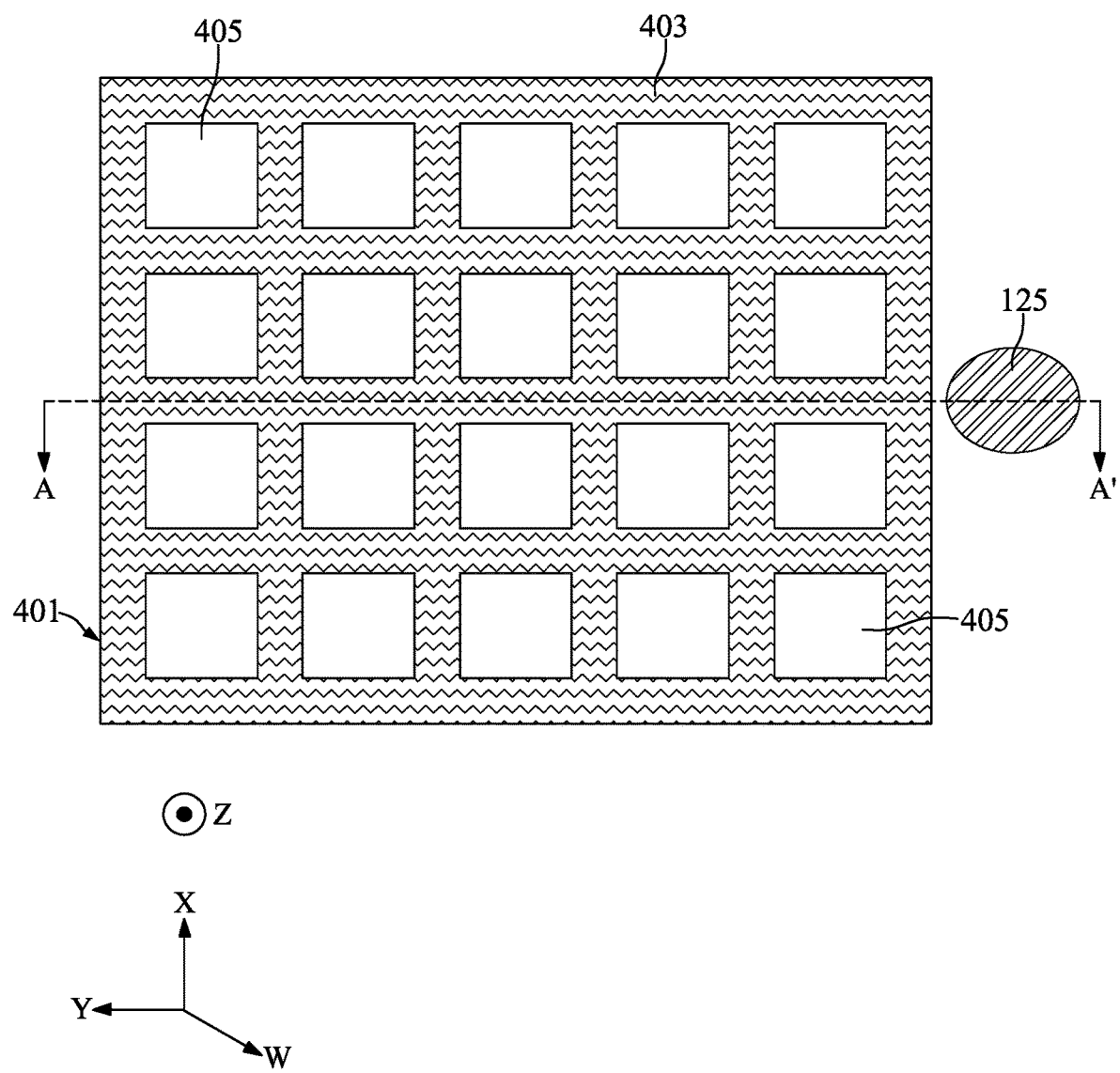
FIG. 22 illustrates, in a schematic top-view diagram, the semiconductor device in accordance with one embodiment of the present disclosure.
Figure 23:
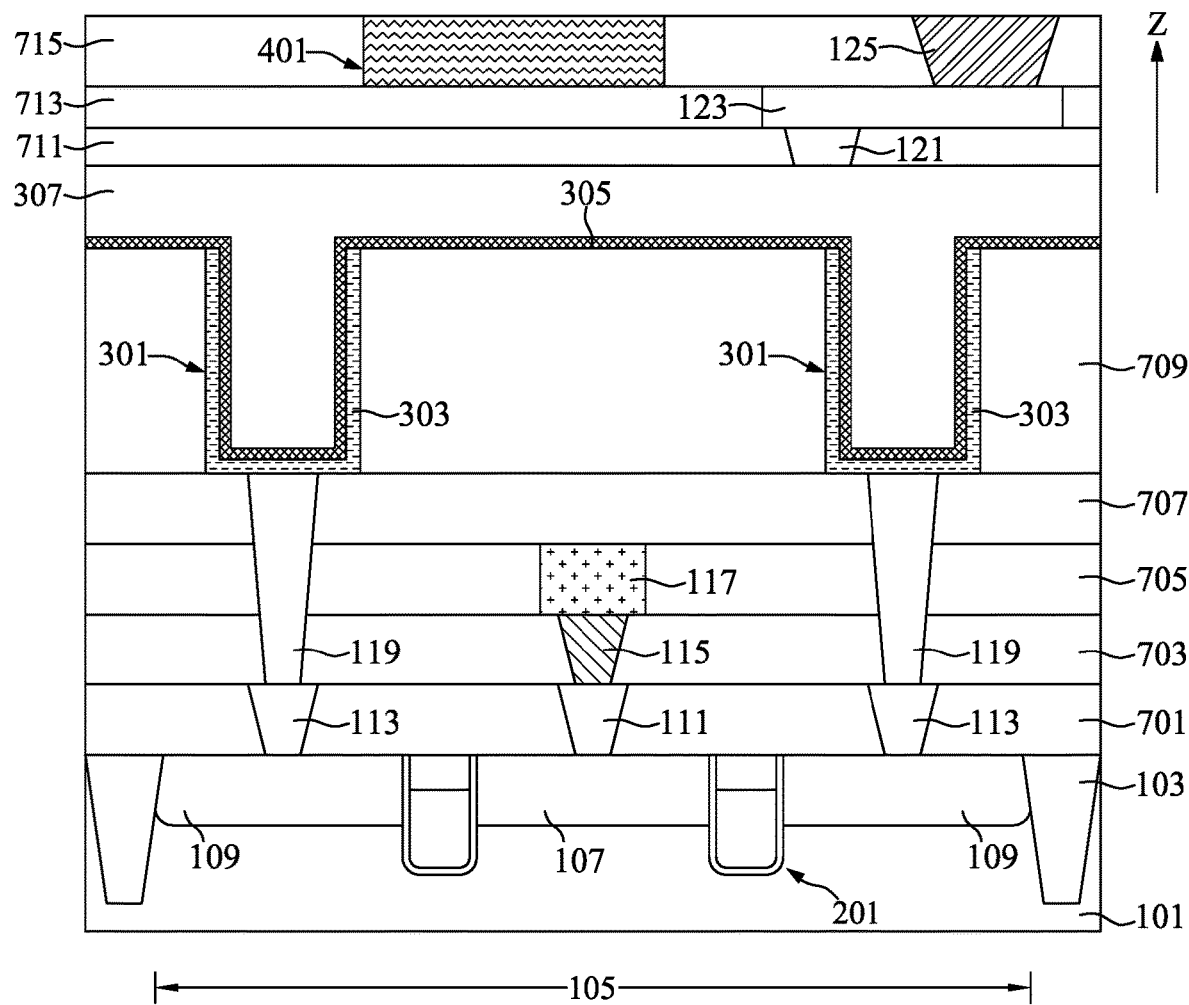
FIG. 23 illustrates, in a schematic cross-sectional diagram taken along a line A-A' in FIG. 23, part of a flow of fabricating a semiconductor device in accordance with one embodiment of the present disclosure.

FIGS. 18 to 21 illustrate, in schematic cross-sectional diagrams, part of a flow of fabricating a semiconductor device in accordance with one embodiment of the present disclosure. FIG. 22 illustrates, in a schematic top-view diagram, the semiconductor device in accordance with one embodiment of the present disclosure. FIG. 23 illustrates, in a schematic cross-sectional diagram taken along a line A-A' in FIG. 22, part of a flow of fabricating a semiconductor device in accordance with one embodiment of the present disclosure. Some elements of the semiconductor device of the present disclosure are not shown in FIG. 23 for clarity.

Figure 18:
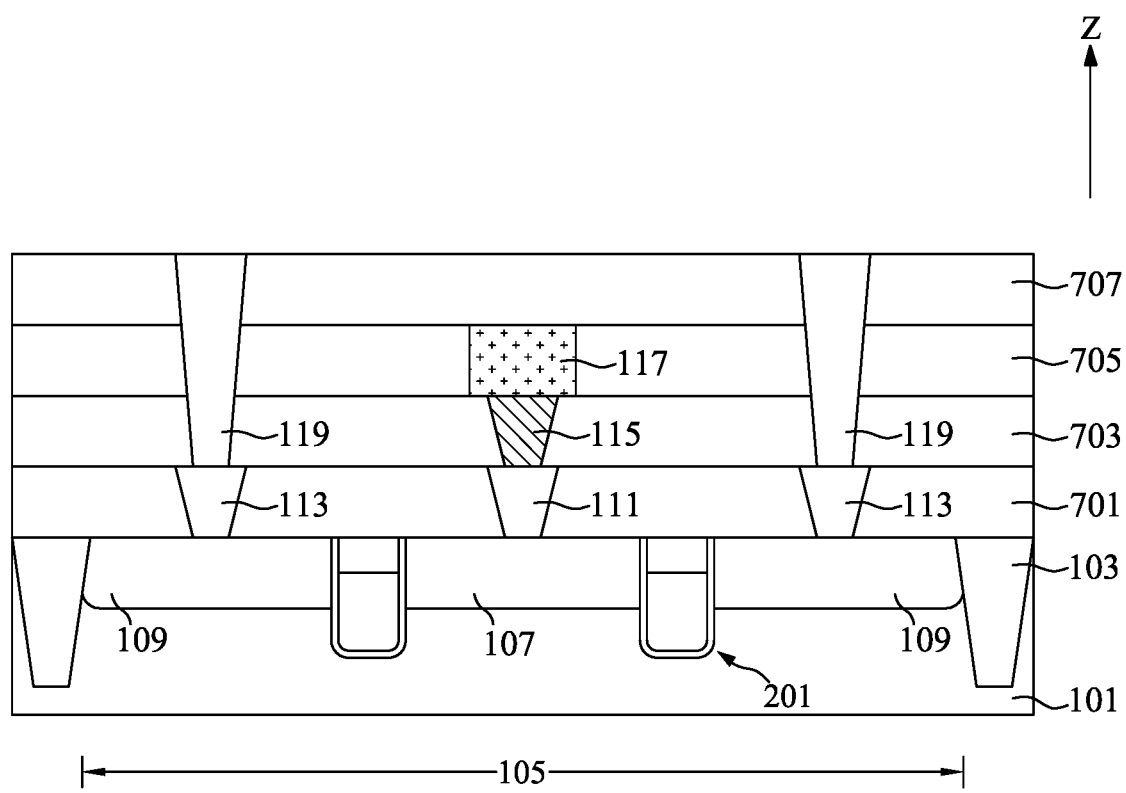
FIGS. 18 to 21 illustrate, in schematic cross-sectional diagrams, part of a flow of fabricating a semiconductor device in accordance with one embodiment of the present disclosure.

With reference to FIGS. 9 and 18 to 21, at step S17, in the embodiment depicted, a plurality of capacitor structures 301 may be formed above the substrate 101. The plurality of capacitor structures 301 may include a plurality of capacitor bottom electrodes 303, a capacitor insulating layer 305, and a capacitor top electrode 307. With reference to FIG. 18, a fourth insulating film 707 may be formed on the third insulating film 705. A plurality of capacitor plugs 119 may be formed so as to extend through the fourth insulating film 707, the third insulating film 705, and the second insulating film 703. For each of the plurality of active regions 105, the plurality of capacitor plugs 119 may be respectively correspondingly disposed on the two second contacts 113.

Figure 19:
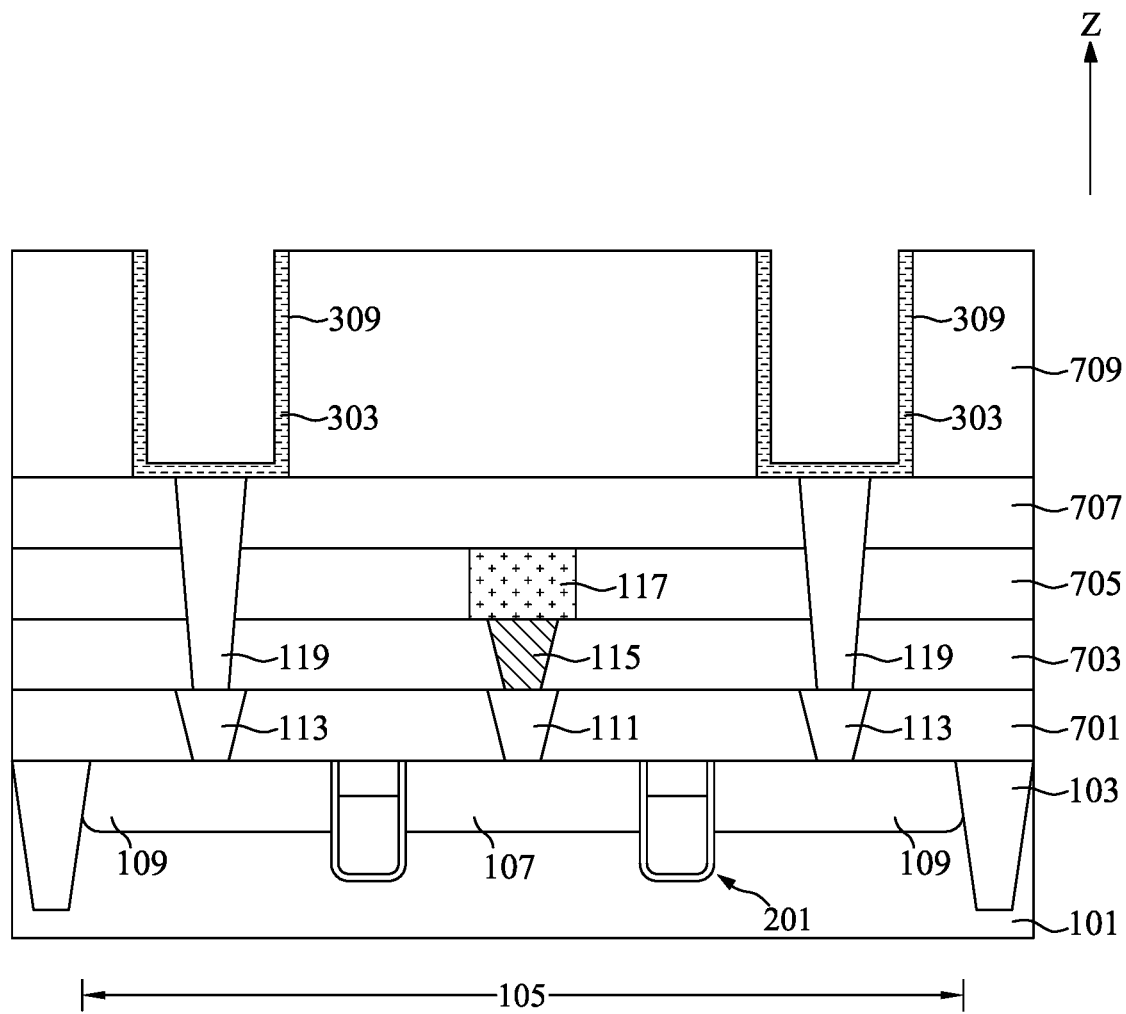

With reference to FIG. 19, a fifth insulating film 709 may be formed on the fourth insulating film 707. A plurality of capacitor trenches 309 may be inwardly formed in the fifth insulating film 709. The plurality of capacitor bottom electrodes 303 may be respectively correspondingly formed in the plurality of capacitor trenches 309. With reference to FIG. 20, the capacitor insulating layer 305 may be formed on the plurality of capacitor bottom electrodes 303. With reference to FIG. 21, a capacitor top electrode 307 may be formed on the capacitor insulating layer 305 and may fill the plurality of capacitor trenches 309.

With reference to FIGS. 9, 22, and 23, at step S19, in the embodiment depicted, an intrinsically conductive pad 125 and a stress relief structure 401 may be formed above the substrate 101. The stress relief structure 401 may include a conductive frame 403 and a plurality of insulating segments 405. With reference to FIGS. 22 and 23, a sixth insulating film 711 and a seventh insulating film 713 may be sequentially formed on the capacitor top electrode 307. A first conductive via 121 may be formed in the sixth insulating film 711 and on the capacitor top electrode 307. A first conductive layer 123 may be formed in the seventh insulating film 713 and on the first conductive via 121. The intrinsically conductive pad 125 and the stress relief structure 401 may be concurrently formed in the eighth insulating film 715, but are not limited thereto.

With reference to FIGS. 22 and 23, in the embodiment depicted, a conductive layer may be formed on the seventh insulating film 713 by a first deposition process such as chemical vapor deposition, physical vapor deposition, sputtering deposition, electroplating, or electroless plating. A photolithography process may be performed to define positions of the intrinsically conductive pad 125 and the conductive frame 403. After the photolithography process, an etch process, such as an anisotropic dry etch process, may be performed to form the intrinsically conductive pad 125 and the conductive frame 403 on the seventh insulating film 713. Subsequently, a second deposition process may be performed to deposit an insulating layer over the seventh insulating film 713 and cover the intrinsically conductive pad 125 and the stress relief structure 401. After the second deposition process, a planarization process, such as chemical mechanical polishing, may be performed until top surfaces of the intrinsically conductive pad 125 and the conductive frame 403 are exposed, and concurrently form the eighth insulating film 715 and the plurality of insulating segments 405 within the conductive frame 403.

FIGS. 24 to 30 illustrate, in schematic cross-sectional diagrams, part of a flow of fabricating the semiconductor device 100A in accordance with one embodiment of the present disclosure.

Figure 24:
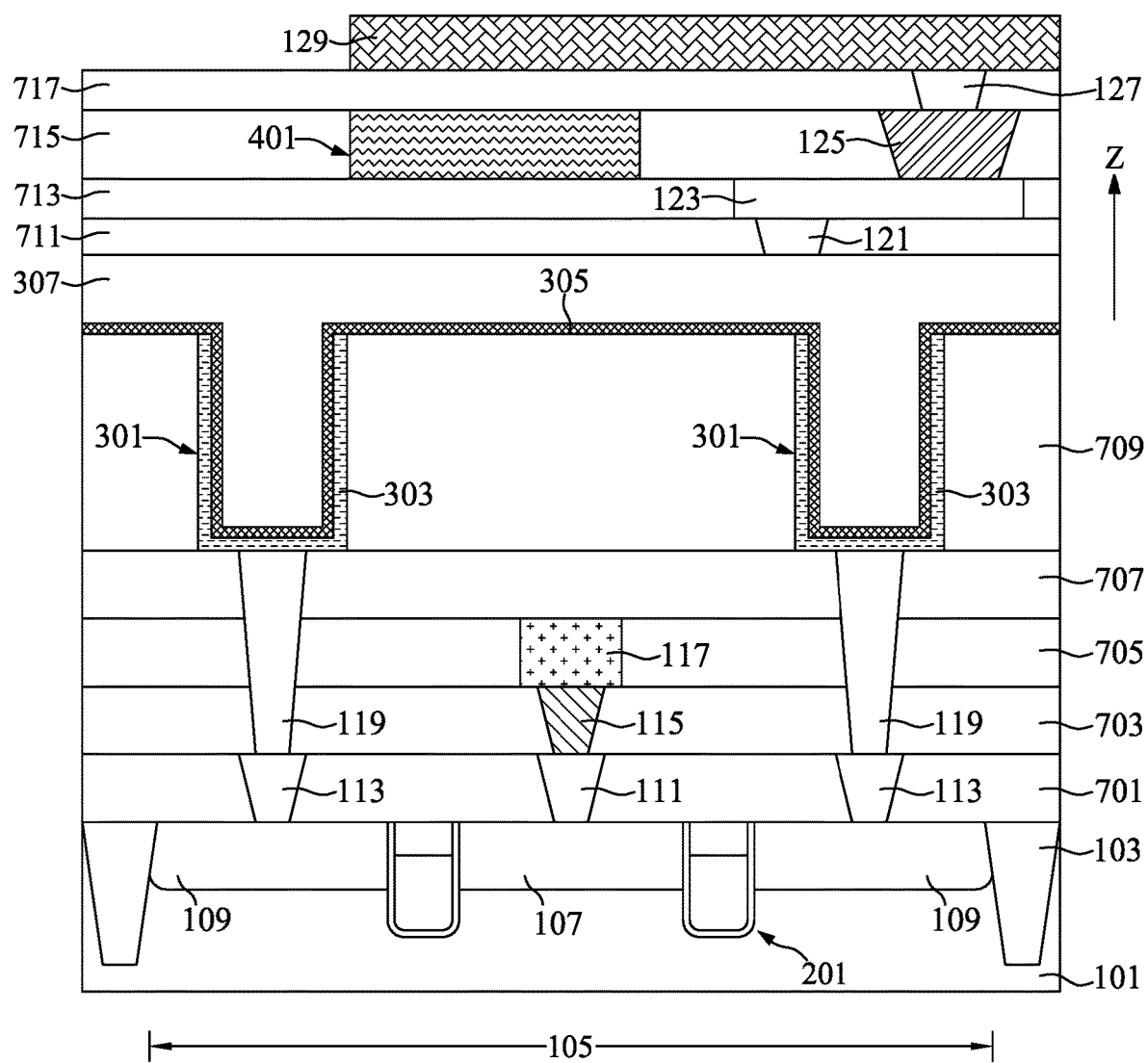
FIGS. 24 to 30 illustrate, in schematic cross-sectional diagrams, part of a flow of fabricating a semiconductor device in accordance with one embodiment of the present disclosure.

With reference to FIGS. 9 and 24, at step S21, in the embodiment depicted, a redistribution conductive layer 129 may be formed above the intrinsically conductive pad 125 and the stress relief structure 401. A ninth insulating film 717 may be formed on the eighth insulating film 715. A redistribution conductive via 127 may be formed in the ninth insulating film 717 and on the intrinsically conductive pad 125. A conductive layer may be formed on the ninth insulating film 717 by a deposition process such as chemical vapor deposition, physical vapor deposition, sputtering deposition, electroplating, or electroless plating. A photolithography process may be performed to define a position of the redistribution conductive layer 129. After the photolithography process, an etch process, such as an anisotropic dry etch process, may be performed to form the redistribution conductive layer 129.

Figure 25:
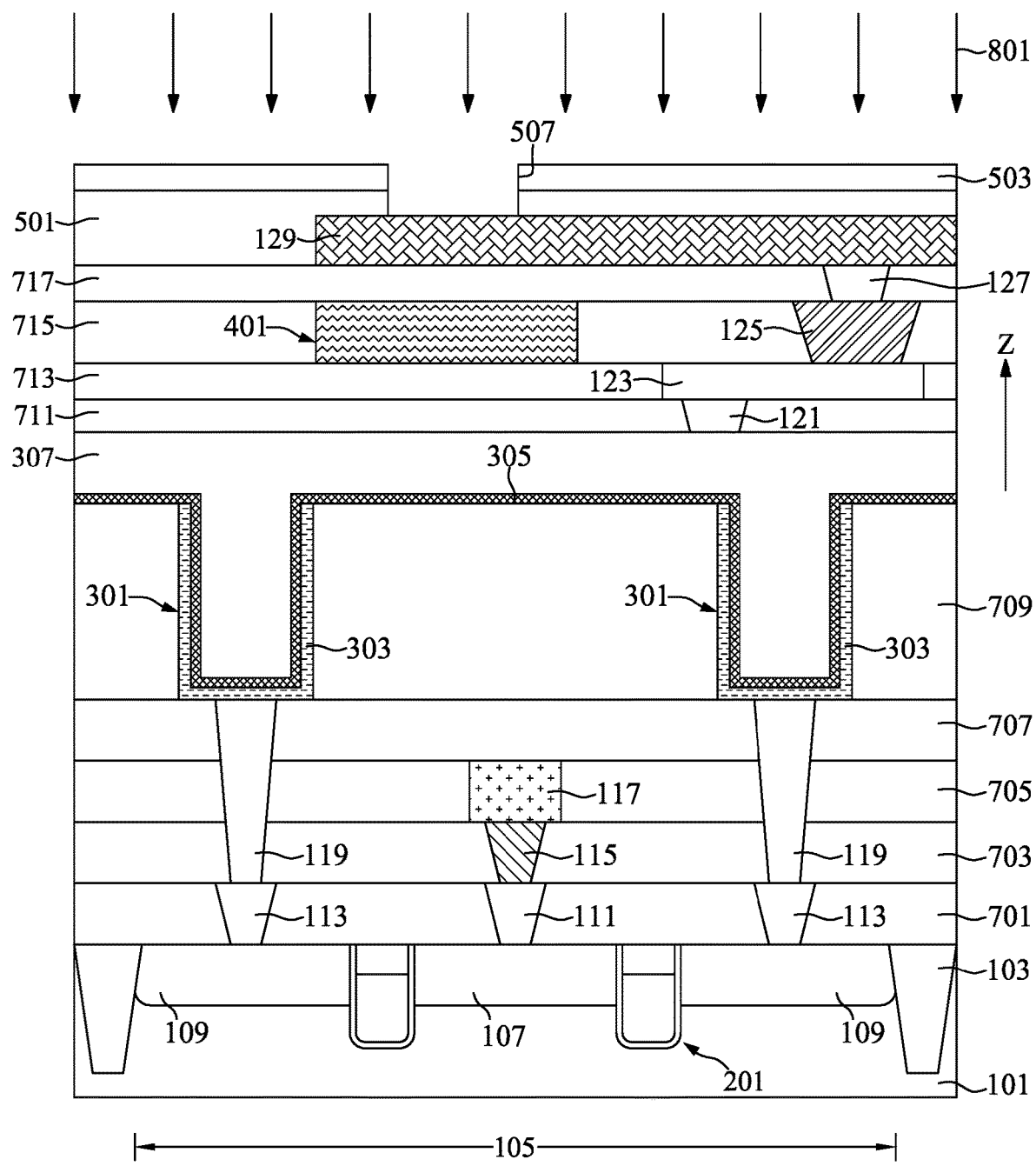

With reference to FIGS. 9 and 25, at step S23, in the embodiment depicted, a first passivation layer 501 and a second passivation layer 503 may be sequentially formed on the ninth insulating film 717 and the redistribution conductive layer 129, a first pad opening 507 may be formed so as to penetrate through the first passivation layer 501 and the second passivation layer 503, and a cleaning process 801 may be performed on the second passivation layer 503 and the first pad opening 507. The first passivation layer 501 may be formed on the ninth insulating film 717 and the redistribution conductive layer 129 by a deposition process. A planarization process, such as chemical mechanical polishing, may be performed to provide a substantially flat surface for subsequent processing steps. The second passivation layer 503 may be formed on the first passivation layer 501. A photolithography process may be performed to define a position of the first pad opening 507. After the photolithography process, an etch process, such as an anisotropic dry etch process, may be performed to form the first pad opening 507. A portion of a top surface of the redistribution conductive layer 129 may be exposed through the first pad opening 507.

With reference to FIG. 25, the cleaning process 801 may be performed after the etching process. The cleaning process 801 may include applying a mixture of hydrogen and argon as a remote plasma source with a process temperature between about 250° C. and about 350° C. and a process pressure ranging between about 1 Torr and about 10 Torr in the presence of a bias energy applied to the equipment performing the cleaning process 801. The bias energy may be between about 0 W and 200 W. The cleaning process 801 may remove oxide, originating from oxidation by oxygen in the air, from the top surface of the redistribution conductive layer 129 without damaging the conductive feature of the redistribution conductive layer 129.

Figure 26:
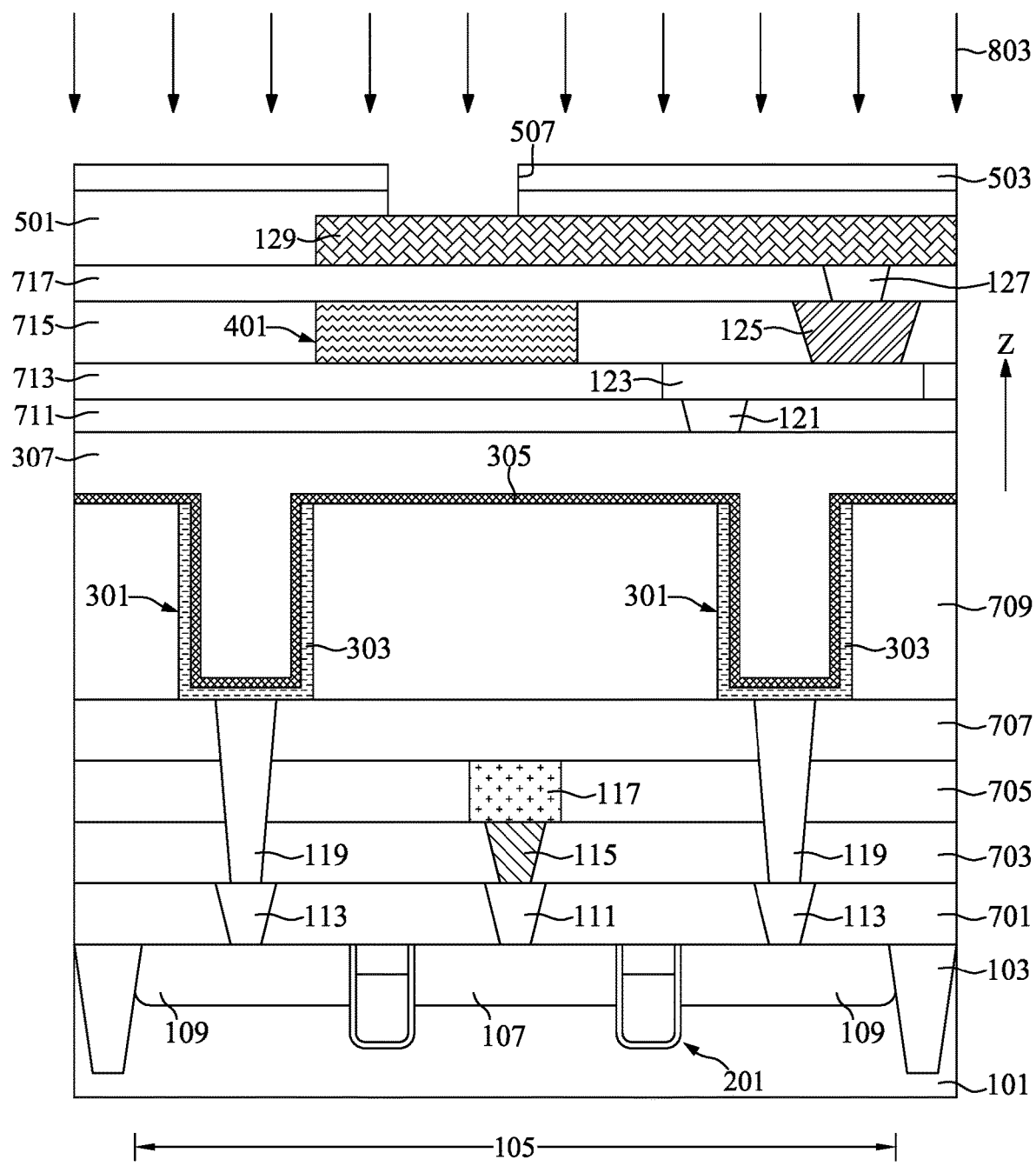

With reference to FIGS. 9 and 26, at step S25, in the embodiment depicted, a passivation process 803 may be performed on the second passivation layer 503 and the first pad opening 507. The passivation process 803 may include soaking the semiconductor device with a precursor such as dimethylaminotrimethylsilane, tetramethylsilane, or the like at a process temperature ranging between about 200° C. and about 400° C. An ultraviolet energy may be used to facilitate the passivation process 803. The passivation process 803 may passivate sidewalls of the second passivation layer 503 and the first passivation layer 501 exposed through the first pad opening 507 by sealing surface pores thereof to reduce undesirable sidewall growth, which may affect the electric characteristics of the semiconductor device, during subsequent processing steps. As a result, the performance and reliability of the semiconductor device may be increased.

Figure 27:
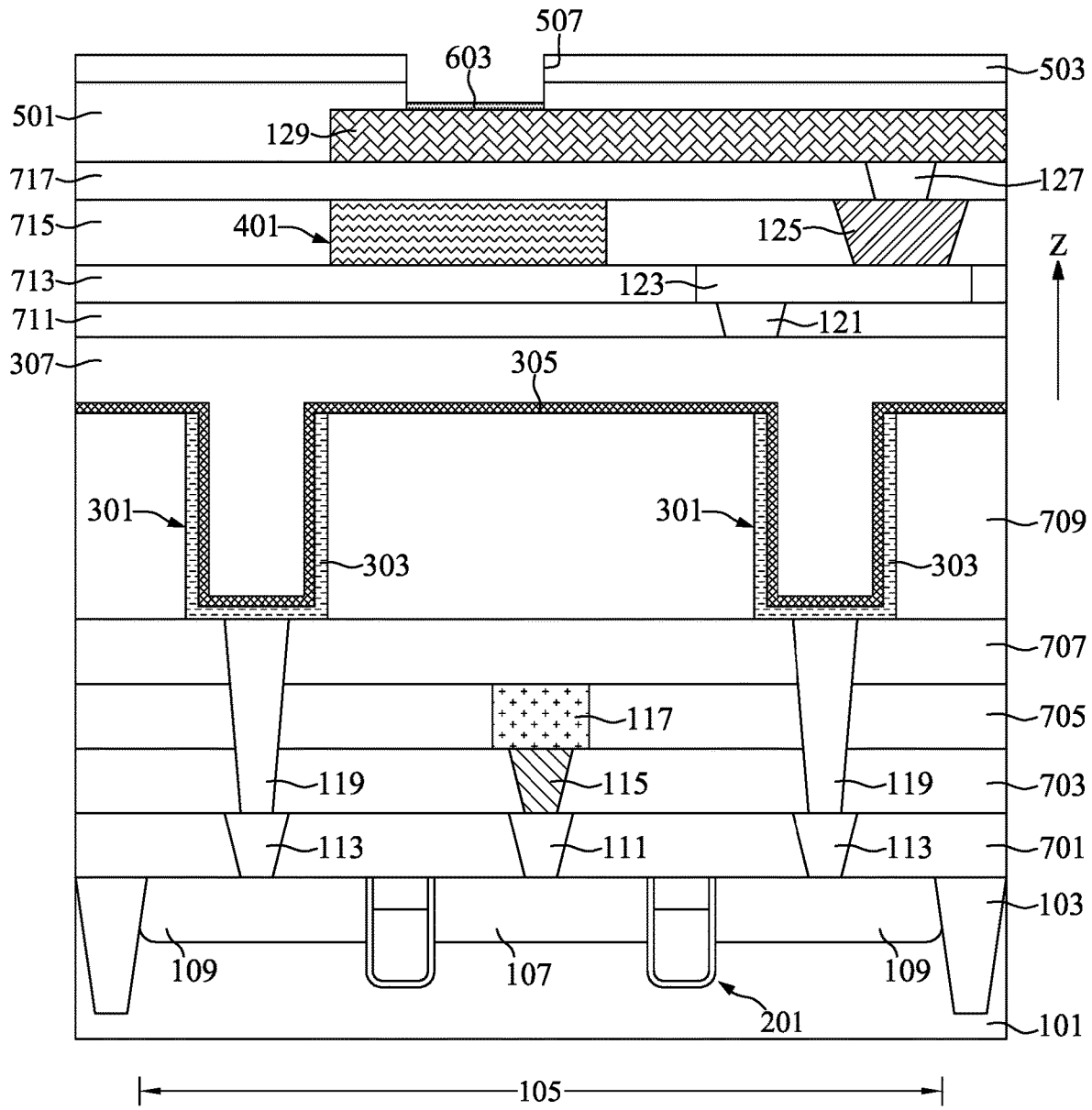
Figure 28:
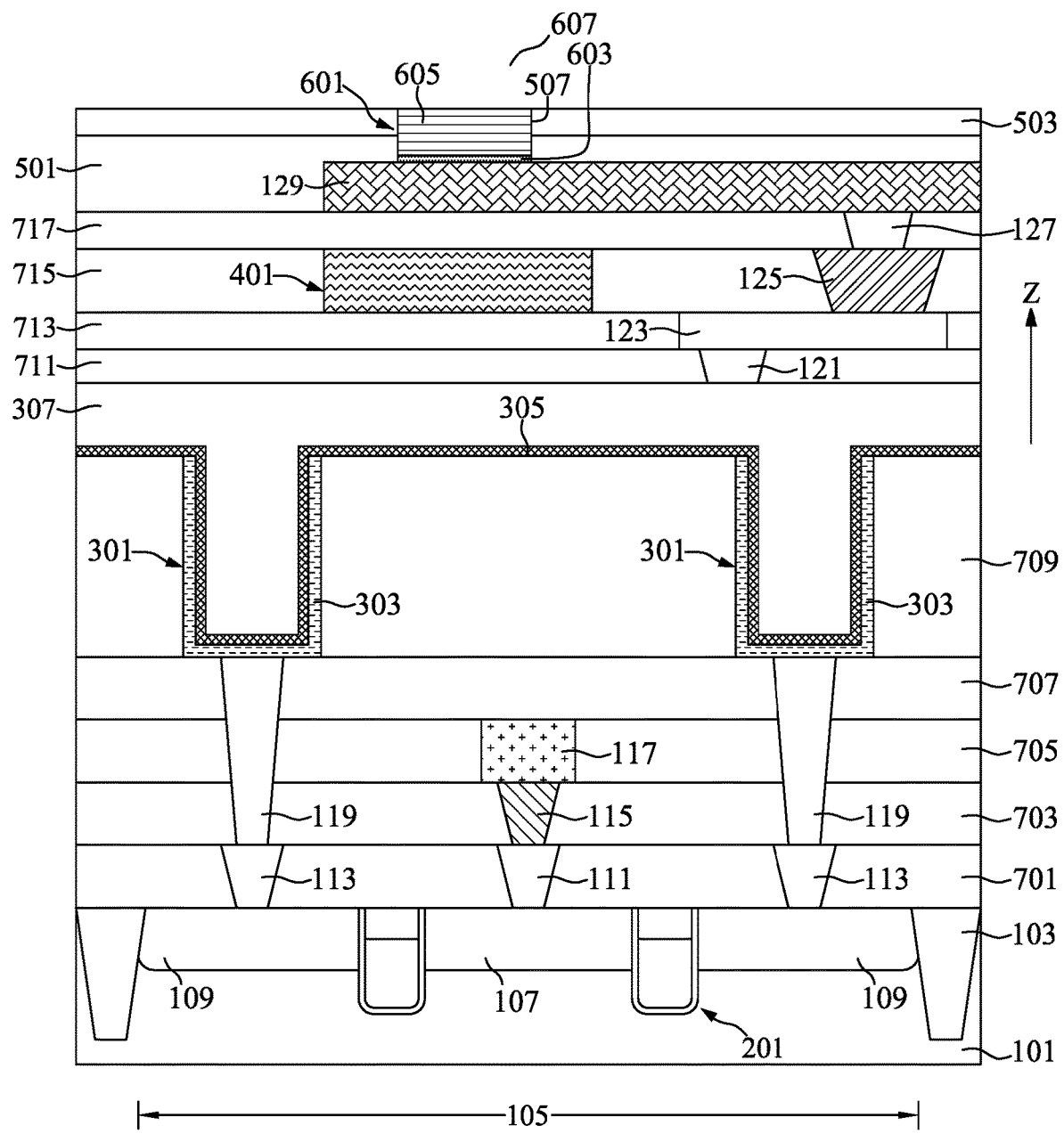

With reference to FIGS. 9, 27 and 28, at step S27, in the embodiment depicted, an external bonding structure 601 may be formed in the first pad opening 507. The external bonding structure 601 may include a bottom bonding layer 603 and a top bonding layer 605. With reference to FIG. 27, the bottom bonding layer 603 may be formed on the redistribution conductive layer 129 in the first pad opening 507 by electroplating or electroless plating. The bottom bonding layer 603 may include nickel and may serve as a barrier between the redistribution conductive layer 129 formed of copper and the top bonding layer 605. With reference to FIG. 28, the top bonding layer 605 may be formed on the bottom bonding layer 603 in the first pad opening 507 by electroplating or electroless plating. The top bonding layer 605 may include palladium, cobalt, or a combination thereof. A top surface of the top bonding layer 605 may include a plurality of heterogeneous nucleation sites such as topographical features, lattice discontinuities/orientations, surface defects, textures, or other surface features. The plurality of heterogeneous nucleation sites on the top surface of the top bonding layer 605 may facilitate a subsequent wiring/bonding process.

Figure 29:
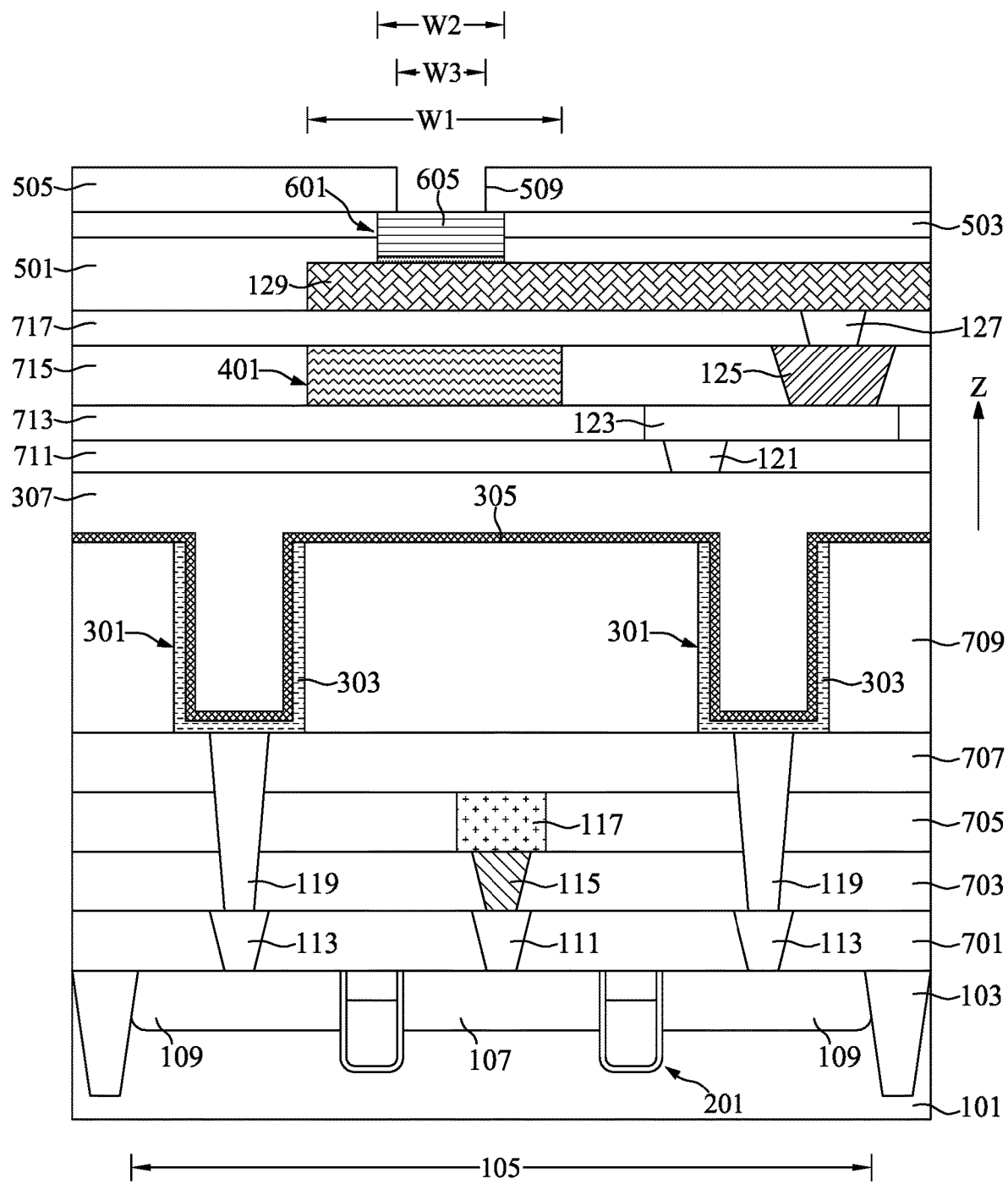
Figure 30:
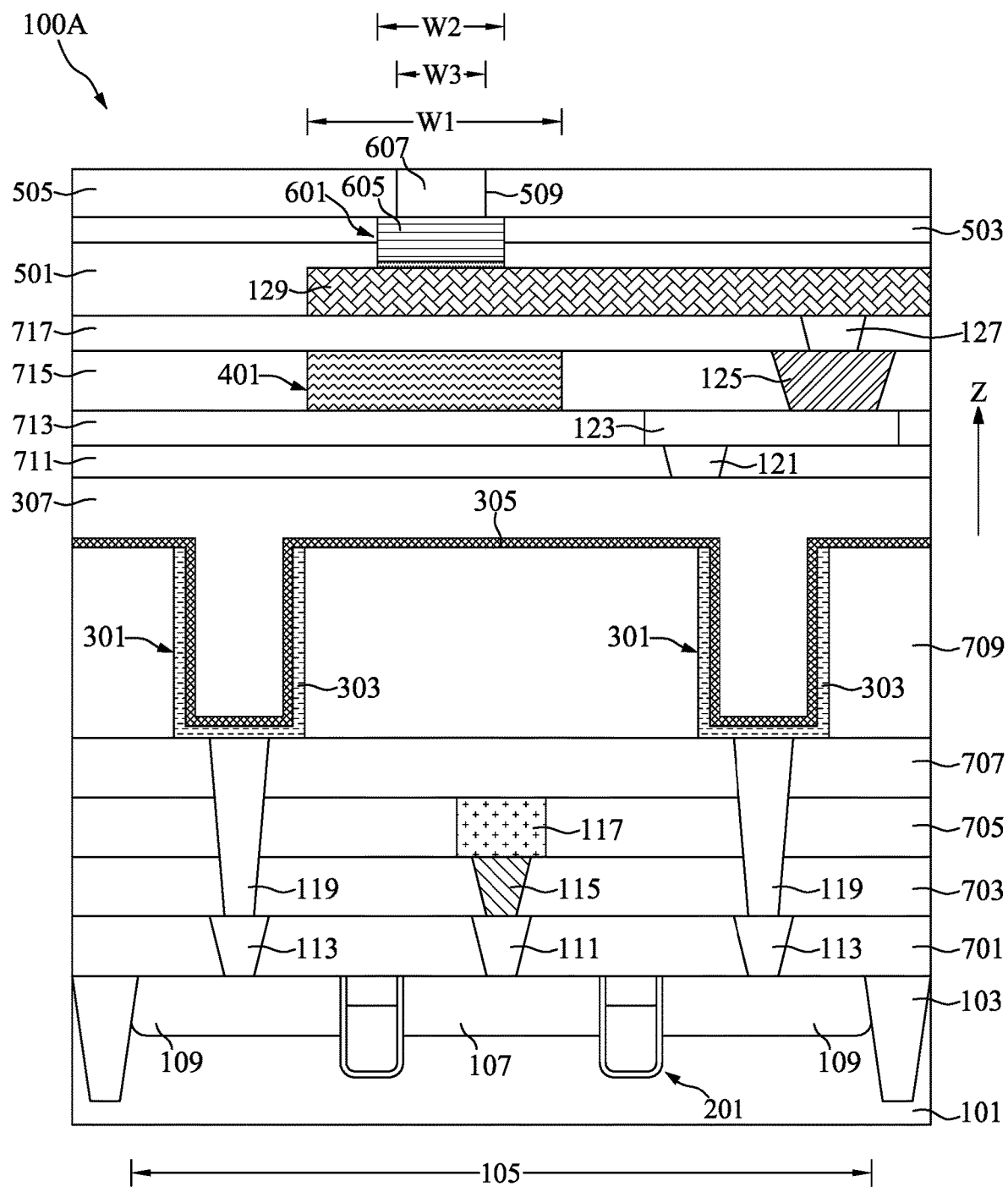

With reference to FIGS. 9, 29 and 30, at step S29, in the embodiment depicted, a third passivation layer 505 and a wiring layer 607 may be formed on the second passivation layer 503. With reference to FIG. 29, the third passivation layer 505 may be formed on the second passivation layer 503. The third passivation layer 505 may include polyimide or polyamide. A photolithography process may be performed to define a position of the wiring layer 607 in the third passivation layer 505. After the photolithography process, an etch process, such as an anisotropic dry etch process, may be performed to form a second pad opening 509. A portion of the top surface of the top bonding layer 605 may be exposed through the second pad opening 509. With reference to FIG. 30, the wiring layer 607 may be formed in the second pad opening 509 and on the top bonding layer 605.

FIGS. 31 to 35 illustrate, in schematic cross-sectional diagrams, part of a flow of fabricating a semiconductor device 100E in accordance with another embodiment of the present disclosure.

Figure 31:
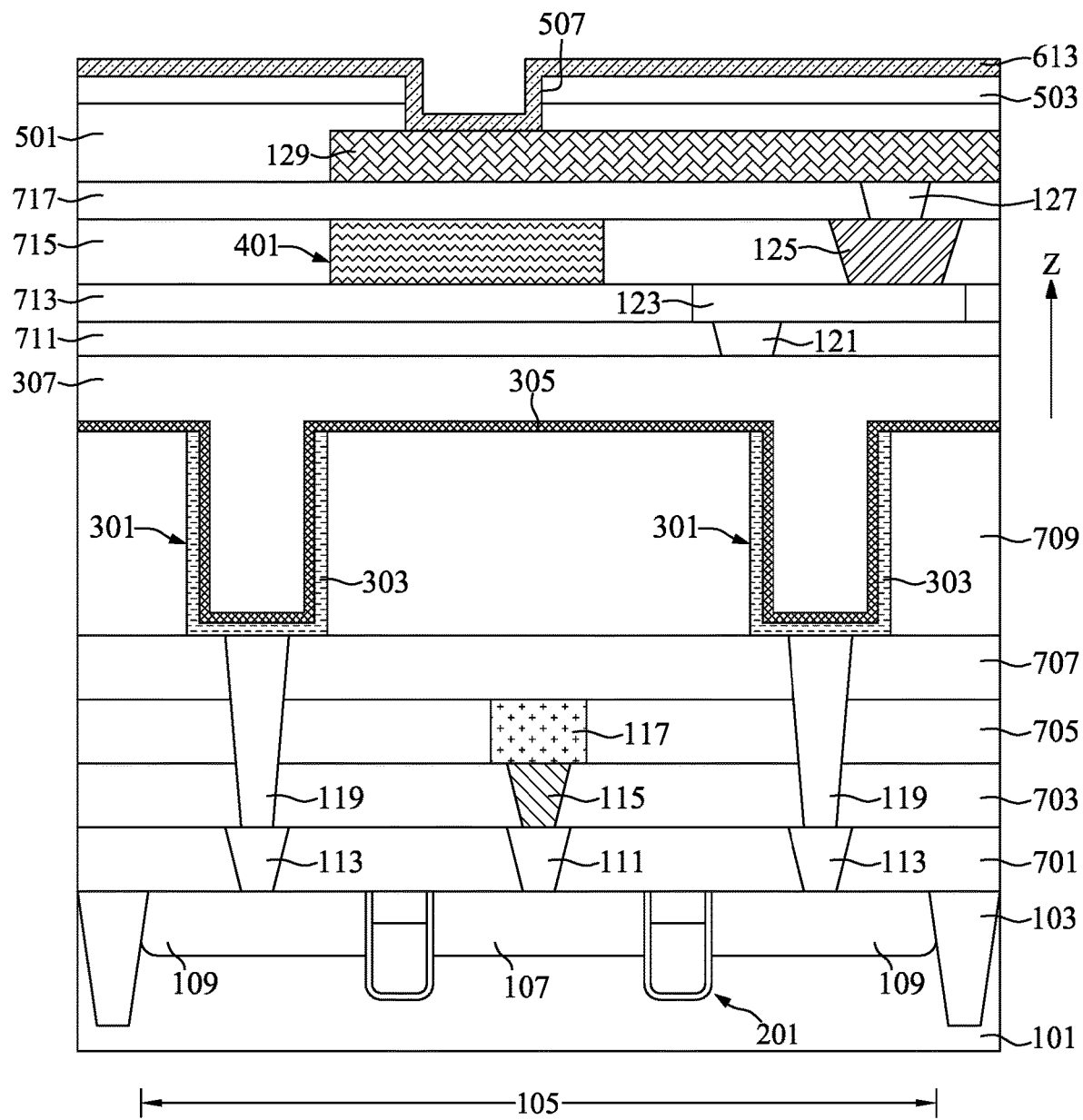
FIGS. 31 to 35 illustrate, in schematic cross-sectional diagrams, part of a flow of fabricating a semiconductor device in accordance with another embodiment of the present disclosure.
Figure 32:
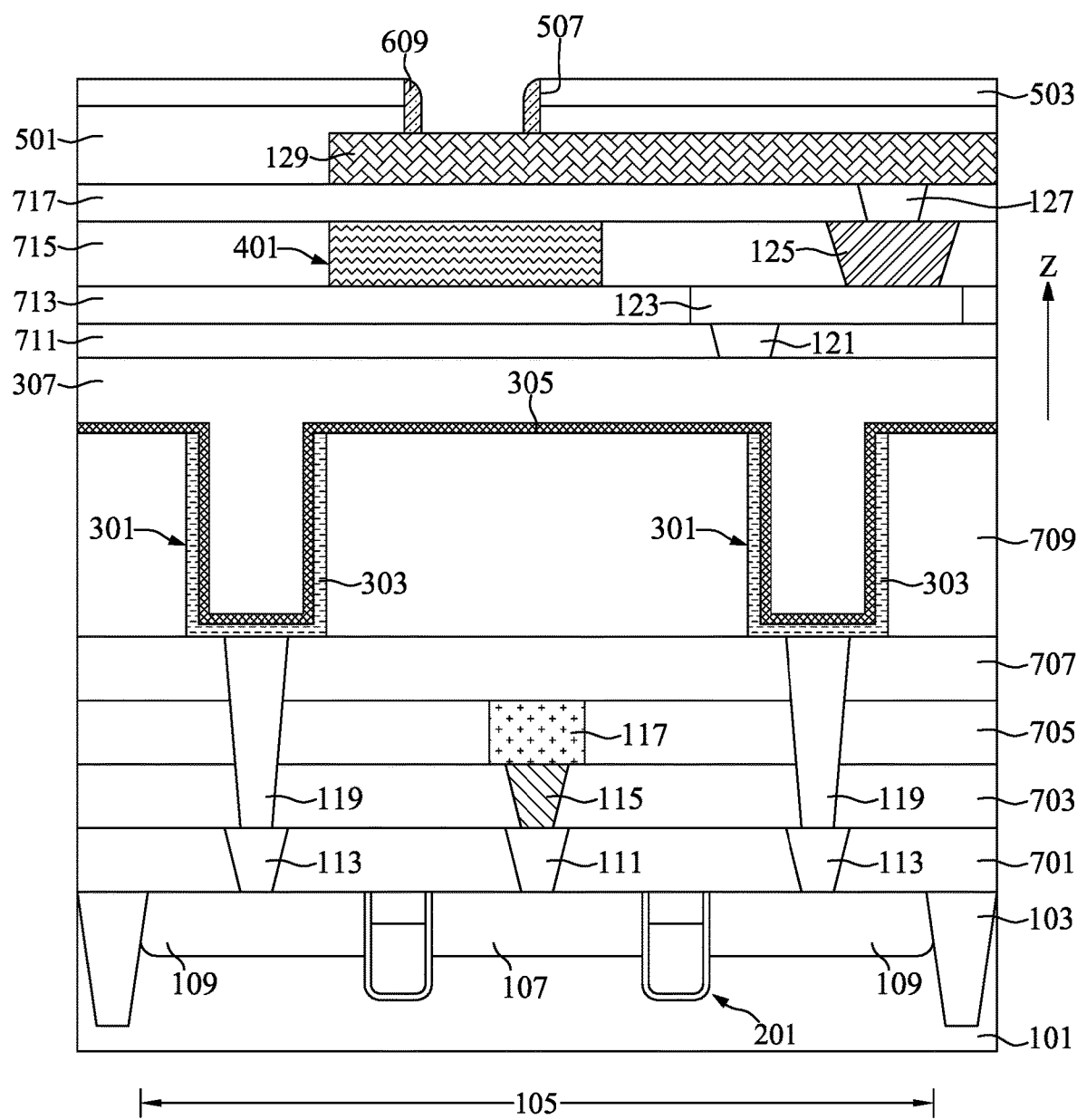
Figure 33:
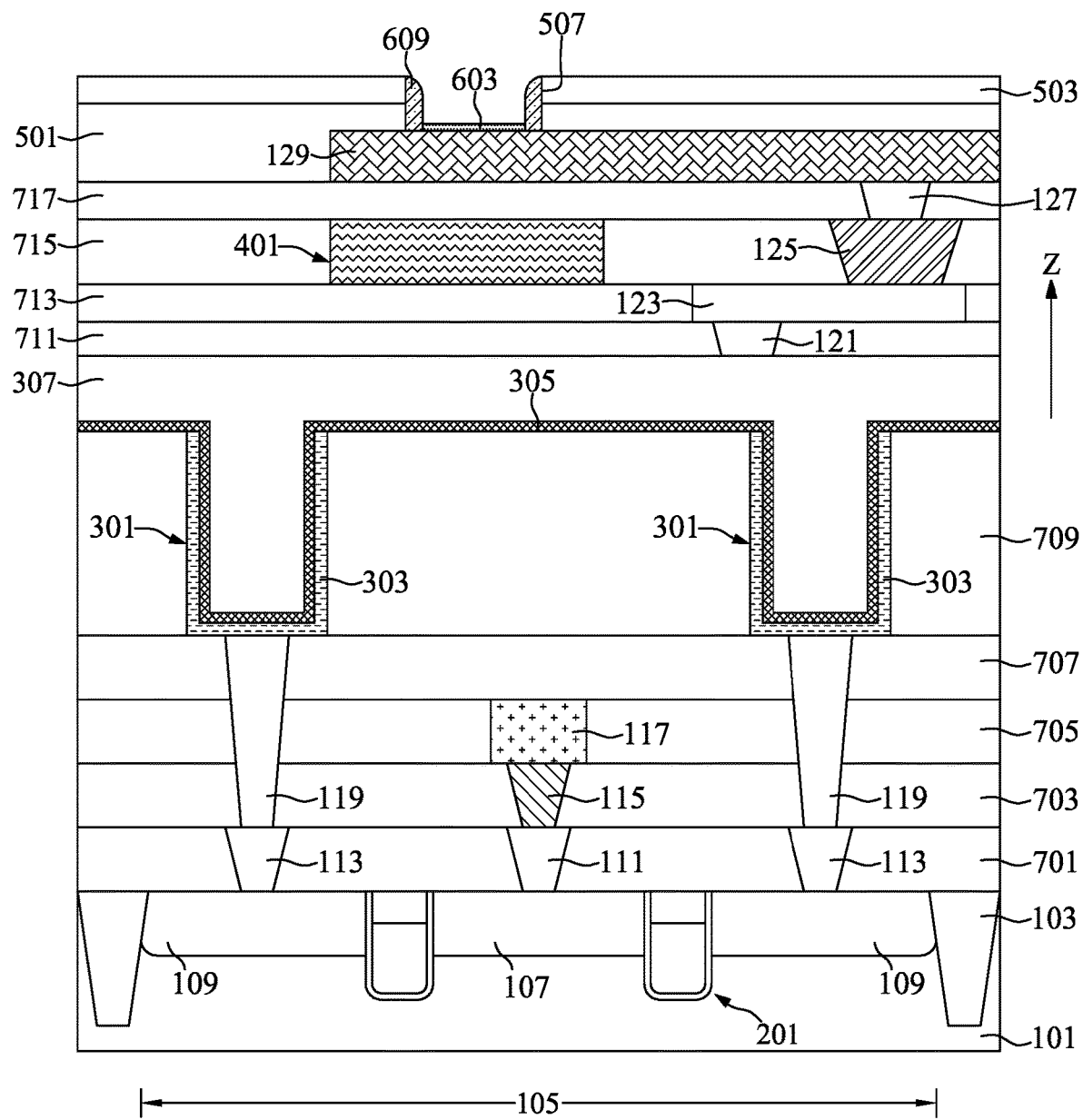
Figure 34:
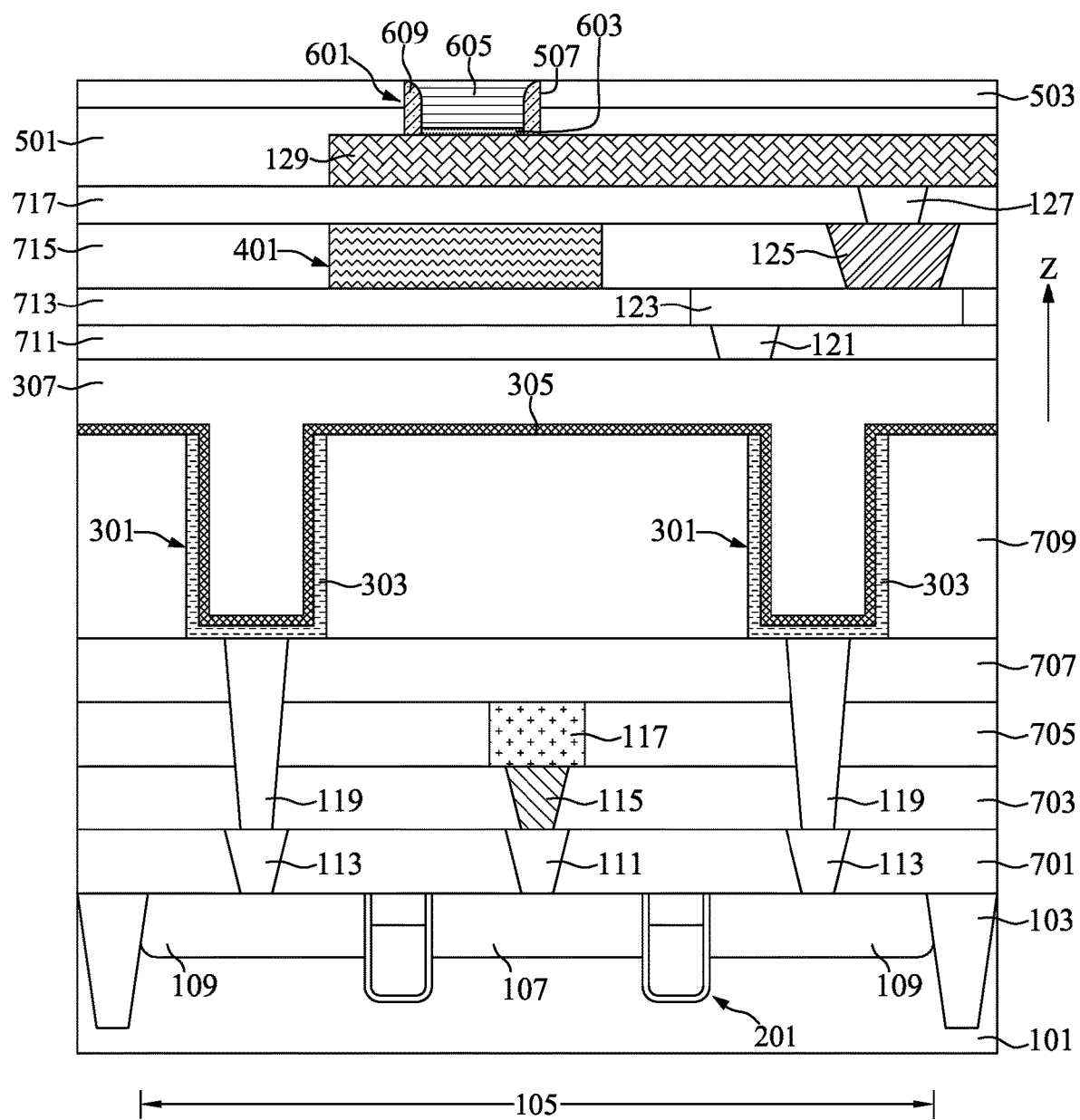
Figure 35:
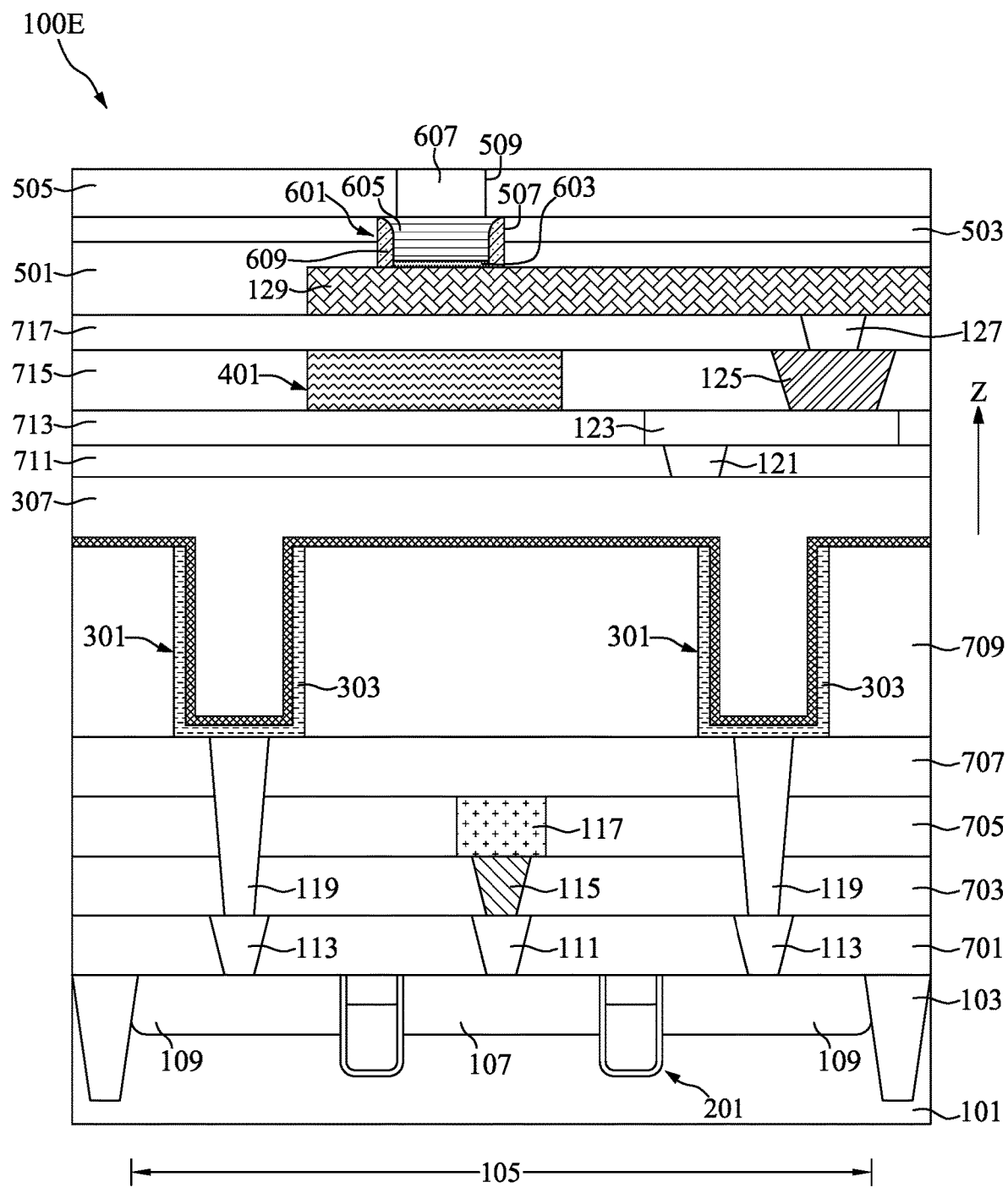

With reference to FIG. 31, a spacer layer 613 may be formed over a top surface of the second passivation layer 503 and in the first pad opening 507. The spacer layer 613 may be formed of, for example, silicon oxide. With reference to FIG. 32, an etch process, such as an anisotropic dry etch process, may be performed to remove portions of the spacer layer 613 formed over the top surface of the second passivation layer 503 and on a bottom of the first pad opening 507 and concurrently form two spacers 609 attached to sidewalls of the first pad opening 507. With reference to FIGS. 33 and 34, the external bonding structure 601 may be formed by a procedure similar to that illustrated in FIGS. 27 and 28. The bottom bonding layer 603 may be formed on the redistribution conductive layer 129 and between the two spacers 609. The top bonding layer 605 may be formed on the bottom bonding layer 603 and between the two spacers 609. With reference to FIG. 35, the third passivation layer 505 and the wiring layer 607 may be formed by a procedure similar to that illustrated in FIGS. 29 and 30.

Due to the design of the semiconductor device of the present disclosure, the stress relief structure 401 may distribute the stress of wiring; therefore, the delamination of the plurality of insulating films may be reduced. As a result, the yield of the semiconductor device may be improved. In addition, the passivation process 803 may reduce undesirable sidewall growth of the plurality of passivation layers.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
   providing a substrate;
   forming a plurality of insulating films on the substrate, wherein the insulating films are overlapped with each other, wherein one of the insulating films is configured as a common insulating film;
   forming an intrinsically conductive pad above the substrate and disposed in the common insulating film, wherein a height of the intrinsically conductive pad equals to a thickness of the common insulating film;
   forming a stress relief structure in the common insulating film and distant from the intrinsically conductive pad, wherein a height of the stress relief structure equals to the thickness of the common insulating film, such that the height of the intrinsically conductive pad as the height of the stress relief structure, wherein forming the stress relief structure above the substrate and distant from the intrinsically conductive pad comprises:
   forming a conductive frame above the substrate, wherein the conductive frame is made of conductive material and has a mesh structure to enhance a stress-buffering capability; and
   forming a plurality of insulating segments within the conductive frame, wherein the insulating segments are spaced apart from each other within the conductive frame and are made of insulating material capable of absorbing and distributing stress;
   forming a redistribution conductive via in one of the insulating films at the uppermost position and electrically connecting the redistribution conductive via to the intrinsically conductive pad;
   forming a redistribution conductive layer disposed on top of the insulating films and above the intrinsically conductive pad and the stress relief structure, and electrically coupling the redistribution conductive layer to the intrinsically conductive pad through the redistribution conductive via;

forming a plurality of passivation layers on top of the insulating films and forming a first pad opening in the plurality of passivation layers, wherein the redistribution conductive layer is disposed in one of the passivation layers and is in contact with one of the insulating layers at the uppermost position to electrically couple to the redistribution conductive via; and performing a passivation process comprising soaking the first pad opening with a precursor, wherein the precursor is dimethylaminotrimethylsilane or tetramethylsilane.

2. The method for fabricating the semiconductor device of claim 1, further comprising:

performing a cleaning process, wherein the cleaning process comprises applying a remote plasma to the first pad opening.

3. The method for fabricating the semiconductor device of claim 2, further comprising:

forming an external bonding structure on the redistribution conductive layer and in the plurality of passivation layers;

wherein the external bonding structure comprises a bottom bonding layer formed on and electrically connected to the redistribution conductive layer and a top bonding layer formed on and electrically connected to the bottom bonding layer.

4. The method for fabricating the semiconductor device of claim 3, further comprising a stress-buffering layer disposed in one of the insulating films between the stress relief structure and the external bonding structure, wherein the stress-buffering layer is formed of a material having a coefficient of thermal expansion of less than about 20 ppm/° C. and a Young's Modulus of less than about 15 GPa.

5. The method for fabricating the semiconductor device of claim 1, wherein each of the plurality of insulating segments has a square shape and the insulating segments are separated from each other, wherein the plurality of insulating segments are made of the same material as the common insulating film.

6. The method for fabricating the semiconductor device of claim 3, wherein the bottom bonding layer of the external bonding structure is in direct contact with the redistribution conductive layer and directly above the stress relief structure and the top bonding layer is positioned above the bottom bonding layer.

7. The method for fabricating the semiconductor device of claim 3, wherein the external bonding structure further a middle bonding layer between the top bonding layer and the bottom bonding layer, wherein the bottom bonding layer of the external bonding structure is in direct contact with the redistribution conductive layer and directly above the stress relief structure.

8. The method for fabricating the semiconductor device of claim 3, wherein a width of the external bonding structure is less than a width of the stress relief structure.

9. The semiconductor device of claim 3, further comprising: forming a wiring layer on the external bonding structure, and directly aligned above the stress relief structure and the external bonding structure.

10. The semiconductor device of claim 9, wherein a width of the wiring layer is less than a width of the external bonding structure.

11. The semiconductor device of claim 6, further comprising: forming two spacers adjacent to two sides of the external bonding structure, wherein the two spacers are attached to the two sides of the external bonding structure and are made of silicon oxide.

12. A method for fabricating a semiconductor device, comprising:

providing a substrate;

forming a plurality of insulating films on the substrate, wherein the insulating films are overlapped with each other, wherein one of the insulating films is configured as a common insulating film;

forming an intrinsically conductive pad above the substrate and disposed in the common insulating film, wherein a height of the intrinsically conductive pad equals to a thickness of the common insulating film;

forming a stress relief structure in the common insulating film and distant from the intrinsically conductive pad, wherein a height of the stress relief structure equals to the thickness of the common insulating film, such that the height of the intrinsically conductive pad as the height of the stress relief structure, wherein forming the stress relief structure above the substrate and distant from the intrinsically conductive pad comprises:

forming a conductive frame above the substrate, wherein the conductive frame is made of conductive material and has a mesh structure to enhance a stress-buffering capability; and forming a plurality of insulating segments within the conductive frame, wherein the insulating segments are spaced apart from each other within the conductive frame and are made of insulating material capable of absorbing and distributing stress;

forming a redistribution conductive via in one of the insulating films at the uppermost position and electrically connecting the redistribution conductive via to the intrinsically conductive pad;

forming a redistribution conductive layer disposed on top of the insulating films and above the intrinsically conductive pad and the stress relief structure, and electrically coupling the redistribution conductive layer to the intrinsically conductive pad through the redistribution conductive via; and forming a plurality of word lines in the substrate and extending along a first direction, wherein each of the plurality of insulating segments has a rectangular shape and extends along a second direction perpendicular to the first direction, wherein the plurality of insulating segments are made of the same material as the common insulating film.

13. A method for fabricating a semiconductor device, comprising:

providing a substrate;

forming a plurality of insulating films on the substrate, wherein the insulating films are overlapped with each other, wherein one of the insulating films is configured as a common insulating film;

forming an intrinsically conductive pad above the substrate and disposed in the common insulating film, wherein a height of the intrinsically conductive pad equals to a thickness of the common insulating film;

forming a stress relief structure in the common insulating film and distant from the intrinsically conductive pad, wherein a height of the stress relief structure equals to the thickness of the common insulating film, such that the height of the intrinsically conductive pad as the height of the stress relief structure, wherein forming the stress relief structure above the substrate and distant from the intrinsically conductive pad comprises:

forming a conductive frame above the substrate, wherein the conductive frame is made of conductive material and has a mesh structure to enhance a stress-buffering capability; and forming a plurality of insulating segments within the conductive frame, wherein the insulating segments are spaced apart from each other within the conductive frame and are made of insulating material capable of absorbing and distributing stress;

forming a redistribution conductive via in one of the insulating films at the uppermost position and electrically connecting the redistribution conductive via to the intrinsically conductive pad;

forming a redistribution conductive layer disposed on top of the insulating films and above the intrinsically conductive pad and the stress relief structure, and electrically coupling the redistribution conductive layer to the intrinsically conductive pad through the redistribution conductive via; and forming a plurality of word lines in the substrate and extending along a first direction, wherein each of the plurality of insulating segments has a rectangular shape and extends along a second direction diagonal with respect to the first direction, wherein the plurality of insulating segments are made of the same material as the common insulating film.

\* \* \* \* \*